(12) United States Patent
Kojovic et al.

(10) Patent No.: US 7,638,999 B2
(45) Date of Patent: Dec. 29, 2009

(54) PROTECTIVE RELAY DEVICE, SYSTEM AND METHODS FOR ROGOWSKI COIL SENSORS

(75) Inventors: Ljubomir A. Kojovic, Racine, WI (US); Stephen E. Williams, Franklin, WI (US)

(73) Assignee: Cooper Technologies Company, Houston, TX (US)

( * ) Notice: Subject to any disclaimer, the term of this patent is extended or adjusted under 35 U.S.C. 154(b) by 133 days.

(21) Appl. No.: 11/400,087

(22) Filed: Apr. 7, 2006

(65) Prior Publication Data

US 2007/0236208 A1    Oct. 11, 2007

(51) Int. Cl.
*G01R 15/18* (2006.01)

(52) U.S. Cl. .......................... 324/127; 702/58; 702/77

(58) Field of Classification Search ............. 324/117 H, 324/117 R, 126, 127, 509; 361/42, 59–90; 373/60; 702/57–59, 65–66, 77
See application file for complete search history.

(56) References Cited

U.S. PATENT DOCUMENTS

| | | | |
|---|---|---|---|
| 4,039,930 A * | 8/1977 | Lukas | 323/213 |
| 4,063,166 A | 12/1977 | Glavitsch | |
| 4,446,420 A | 5/1984 | Dronet | |
| 4,449,417 A | 5/1984 | Sasaki | |
| 4,570,231 A | 2/1986 | Bunch | |
| 4,623,949 A | 11/1986 | Salowe et al. | |
| 4,709,205 A | 11/1987 | Baurand et al. | |
| 4,709,339 A | 11/1987 | Fernandes | |
| 4,749,940 A | 6/1988 | Bullock | |
| 4,766,549 A | 8/1988 | Schweitzer et al. | |
| 4,933,630 A | 6/1990 | Dupraz | |
| 4,939,449 A | 7/1990 | Cattaneo et al. | |
| 5,115,447 A | 5/1992 | Bowman | |
| 5,128,611 A * | 7/1992 | Konrad | 324/142 |
| 5,414,400 A | 5/1995 | Gris et al. | |
| 5,434,509 A | 7/1995 | Blades | |
| 5,442,280 A | 8/1995 | Baudart | |
| 5,461,309 A | 10/1995 | Baudart | |
| 5,608,327 A | 3/1997 | Jones et al. | |
| 5,825,189 A | 10/1998 | Johns | |
| 5,852,395 A | 12/1998 | Bosco et al. | |
| 5,903,155 A | 5/1999 | Bjorklund | |
| 6,313,623 B1 | 11/2001 | Kojovic et al. | |
| 6,397,156 B1 * | 5/2002 | Bachmann et al. | 702/65 |

(Continued)

FOREIGN PATENT DOCUMENTS

EP    0 494 720    6/1974

(Continued)

OTHER PUBLICATIONS

U.S. Appl. No. 11/999,813, filed Dec. 7, 2007, Kojovic et al.

(Continued)

*Primary Examiner*—Ha Tran T Nguyen
*Assistant Examiner*—Arleen M Vazquez
(74) *Attorney, Agent, or Firm*—King & Spalding LLP

(57) ABSTRACT

Relay devices, systems and methods for obtaining an accurate representation of a current monitored with a Rogowski coil, without integration of the Rogowski coil output voltage signal in the time domain.

20 Claims, 16 Drawing Sheets

U.S. PATENT DOCUMENTS

| | | | |
|---|---|---|---|
| 6,414,475 B1* | 7/2002 | Dames et al. | 324/127 |
| 6,544,314 B2 | 4/2003 | Stendera et al. | |
| 6,563,296 B2 | 5/2003 | Cooke | |
| 6,597,180 B1 | 7/2003 | Takaoka et al. | |
| 6,680,608 B2 | 1/2004 | Kojovic | |
| 6,713,998 B2* | 3/2004 | Stanimirov et al. | 324/117 R |
| 6,781,361 B2* | 8/2004 | Nestler | 324/142 |
| 6,782,329 B2 | 8/2004 | Scott | |
| 6,810,069 B2 | 10/2004 | Kojovic et al. | |
| 6,822,457 B2 | 11/2004 | Borchert et al. | |
| 6,940,702 B2 | 9/2005 | Kojovic et al. | |
| 6,954,704 B2* | 10/2005 | Minami et al. | 702/62 |
| 7,180,717 B2 | 2/2007 | Kojovic et al. | |
| 7,227,347 B2* | 6/2007 | Viaro et al. | 324/117 H |
| 2001/0029433 A1 | 11/2001 | Scott | |
| 2002/0125877 A1 | 9/2002 | Cooke | |
| 2003/0107380 A1* | 6/2003 | Leprettre et al. | 324/511 |
| 2003/0112569 A1 | 6/2003 | Kato et al. | |
| 2004/0012901 A1* | 1/2004 | Kojovic et al. | 361/19 |
| 2004/0027750 A1* | 2/2004 | Minami et al. | 361/62 |
| 2004/0183522 A1 | 9/2004 | Gunn et al. | |
| 2005/0122654 A1* | 6/2005 | Culligan et al. | 361/93.1 |
| 2005/0248430 A1 | 11/2005 | Dupraz | |
| 2006/0012374 A1* | 1/2006 | Kojovic et al. | 324/522 |
| 2007/0236208 A1 | 10/2007 | Kojovic et al. | |

FOREIGN PATENT DOCUMENTS

| | | |
|---|---|---|
| GB | 1 355 827 | 7/1992 |

OTHER PUBLICATIONS

U.S. Appl. No. 11/593,240, filed Nov. 6, 2006, Kojovic et al.
U.S. Appl. No. 11/593,239, filed Nov. 6, 2006, Kojovic et al.
L Kojovic, "Rogowski Coils Suit Relay Protection and Measurement"; Jul. 1997, pp. 47-52.
E. Thuries, et al.; "Contribution of Digital Signal Processing in the Field of Current Transformers"; 1996, pp. 1-11.
P. Mahonen et al., "The Rogowski Coil and the Voltage Divider in Power System Protection and Monitoring"; 1996, pp. 1-7.
G. Schett et al., "The Intelligent GIS—A Fundamental Change in the Combination of Primary and Secondary Equipment", CIGRE, 1996, Switzerland, pp. 1-10.
V. Heumann, "Magnetischer Spannungsmesser Hoher Praazision," Elektrotechnische Zeitschrift Ausgabe A, May 21, 1962, Germany, pp. 349-356.

\* cited by examiner

US 7,638,999 B2

PROTECTIVE RELAY DEVICE, SYSTEM AND METHODS FOR ROGOWSKI COIL SENSORS

BACKGROUND OF THE INVENTION

This invention relates generally to electrical power systems, and more specifically to protective relay systems and controls therefor.

Electrical generation and power transmission networks include a large number of transformers, capacitor banks, reactors, motors, generators and other major pieces of electrical equipment. Such equipment is expensive, and each piece of equipment typically plays a vital role in the distribution of power to end users, such that an outage caused by the equipment being damaged or taken out of service for repair or replacement, may have costly consequences. As a result, such equipment is typically protected from potentially damaging overvoltages and overcurrents by protective components, such as relay devices that open and close portions of the system in response to actual operating conditions.

DETAILED DESCRIPTION OF THE INVENTION

Figure 1:
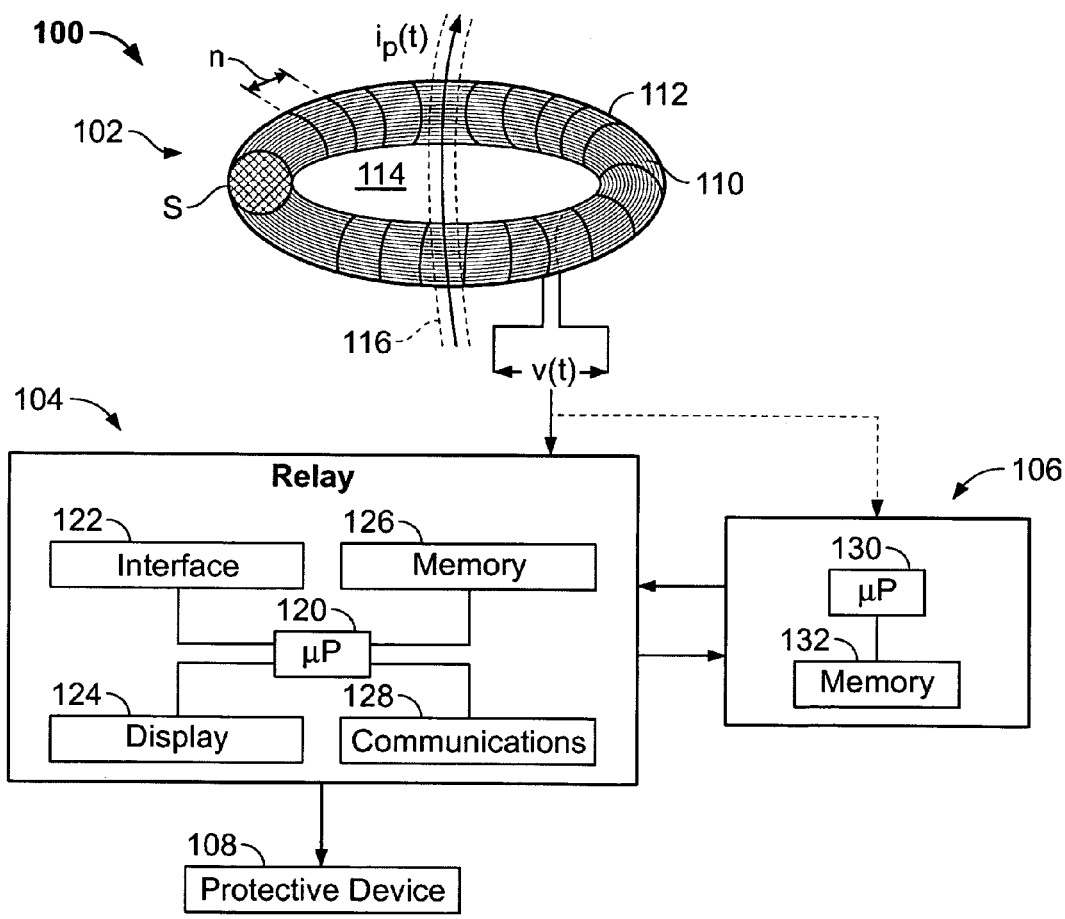
FIG. 1 schematically illustrates a protective relay system according to the present invention.

Successful operation of network protection devices in an electrical power system is of course dependent upon accurate sensing and measurement of operating conditions. Microprocessor based equipment, such as digital relay devices, are increasingly being used in electrical power systems, and complex signal processing issues are raised, especially for phasor based relay systems, to provide input data to the relay devices for making control decisions.

In existing electrical power systems for electric utility companies and industrial facilities, current transformers (CTs) are utilized for measuring operation conditions of the system. The transformers may be connected to network protection devices, such as protective relays and circuit breakers, and signal outputs from the current transformers are input to the protective devices and are used to make control decisions by the network protection devices to open circuitry when fault conditions are detected, thereby protecting the power distribution network and associated equipment from damage. The output signals of the transformers, however, are vulnerable to distortion, and when used with digital equipment, such as modern digital relay devices, complex signal processing is required to convert the transformer output signals to a usable form that may be processed by the digital equipment to make control decisions.

Rogowski coils measure magnetic fields and provide a reliable means of sensing or measuring current flow at a given point in an electrical system, including detection of current flow through a primary winding of a transformer. Early Rogowski coils were not suitable for such current measurements because the coil output voltage and power were not sufficient to drive measuring equipment. With the advent of microprocessor-based protection and measurement equipment, however, Rogowski coils have become more suitable for use in electrical power systems. Signal processing issues, however, still remain to interface analog output signals of Rogowski coils to digital equipment for making control decisions. Complex analog or digital filters are typically required to determine the integral of the output signal of Rogowski coils over time, increasing the cost of such systems and introducing potential errors and reliability issues.

To overcome these and other disadvantages of existing devices, systems and methods, embodiments of protective relay devices, systems and methods are disclosed utilizing Rogowski coils as current detecting elements. Output signals of the Rogowski coils are used to represent current flow through a conductor in the frequency domain without determining integrals of the coil signals in the time domain that is common to known systems. Complex analog or digital filters in the time domain are therefore not required in embodiments of the present invention, while still providing an accurate indication of true current conditions in the conductor. A simpler, yet highly reliable, protective relay device, systems and methods are therefore provided.

For a full appreciation of the inventive aspects of exemplary embodiments of the invention described below, the disclosure herein will be segmented into sections. Basic components of the system are first discussed in Part I. including a discussion regarding construction and operation of Rogowski coils. Conventional devices and methods for measuring current in electrical power systems will be discussed and contrasted with Rogowski coils in Part II. Derivation of operating principles and schematic architecture of the present invention will be discussed in Part III. Validating examples of the invention will be described in Part IV.

I. System Introduction

As shown in FIG. 1, a protective relay system 100 according to an embodiment of the present invention includes a Rogowski coil 102, a protective relay device 104, an optional processing device 106, and a circuit protector device 108. The relay device 104 and or the processing device 106 are processor based devices that may be programmed to perform signal processing from the output of the Rogowski coil 100 according to the methods and algorithms explained below. The relay device 104 is operatively connected to a circuit protector device 108, and depending upon the output signal v(t) of the Rogowski soil coil 102, the relay device 104 causes the circuit protector device 108 to open or interrupt a current path when fault currents are detected.

The Rogowski coil 102 includes a conductive coil or winding 110, fabricated from wire in one example, that is coiled or wound on a non-magnetic core 112 for a number of turns. The core 112 may be formed into a toroid shape, for example, as shown in FIG. 1, that defines a central opening 114 for the passage of a conductor 116 (shown in phantom in FIG. 1) therethrough. To prevent nearby conductors carrying high currents from negatively influencing the output voltage v(t), the Rogowski coil 102 may include different windings 110 connected in the electrically opposite directions on the core 112. The opposing windings 110 will accordingly cancel all electromagnetic fields coming from outside the coil loop. A similar effect may be accomplished by passing the end of a single windings 110 back through the core opening 114.

The basic structure of the Rogowski coil is highly adaptable to meet different needs in use, and the present invention is equally applicable to a wide variety of Rogowski coils. For example, the core 112 may be fabricated from a flexible material such as coaxial cables, or relatively rigid materials such as straight rods connected to one another at their ends. Additionally, metering accuracy Rogowski coils may utilize printed circuit boards (PCBs) containing two imprinted coils wound in opposite directions (clockwise and counter-clockwise). This may be achieved by imprinting two windings on one PCB or using two PCBs located next to each other, each containing one imprinted winding. The PCBs may be multi-layered, and high precision is possible with computer controlled manufacturing process and control of the coil geometry.

The Rogowski coil 102 may be constructed with circular, oval, and rectangular shapes, for example, in different embodiments for different applications. Rogowski coils fabricated in oval or rectangular shapes are suitable, for example, to embrace all three-phases of a conductor 116 (for measurement of residual currents) or to embrace parallel conductors 116 that carry heavy currents. As those in the art will appreciate, the Rogowski coil 102 may also be fabricated with a split-core for installation to the conductor 116 without the need to electrically disconnect the conductor 116 from the circuit.

Operationally, the Rogowski coil 102 may be placed around one or more conductors 116 whose currents i(t) are to be sensed or measured. A primary current $i_p(t)$ flowing through the conductor(s) 116 generates a magnetic field that, in turn, induces a secondary voltage v(t) in the windings 110 of the Rogowski coil 102 as further explained below. The voltage output of the Rogowski coil 102 may be connected and input to the relay 104 via wireless communication, electrical wires or cables, fiber-optic cables, or in another manner known in the art. The relay 104 may be programmed to perform the signal processing techniques described below while avoiding the complexity of known signal processing techniques in conventional systems.

The protective relay device 104 may include a microprocessor 120, an interface panel 122, a display 124, a memory 126, and a communications module 128. Control algorithms, parameters, and data may be stored in the microprocessor 120 and the memory 126 and utilized by the microprocessor 120 to execute the algorithms, respond to user inputs via the interface 122, display information to users via the display 124, collect and store data in the memory 126, and communicate with other devices and systems, including but not limited to other protective relay devices. The relay device 104 may include various measuring and/or calculation devices (not shown) such as a voltage-measuring devices or current-calculating devices. Such devices may include, or be associated with, computer hardware or software for performing their respective functions.

relay device 104 may be programmed in a known manner to detect overcurrent and undercurrent conditions, overvoltage and undervoltage conditions, voltage and current differentials, and conduct frequency analysis, power analysis, load shedding analysis and power signal analysis. Additionally, the relay device 104 may also perform event recording routines for data collection and analysis, signal synchronization procedures, and conduct equipment protection routines for specific devices (e.g., motors, transformers, generators, and capacitors). Suitable relay devices 104 for purposes of the present invention include the Edison® Idea™ of protective relays available from Cooper Power Systems, Inc. of Waukesha, Wis.

Optionally, the system 100 includes a second microprocessor based device 106, separately provided from the relay device 104, having a microprocessor 130 and a memory 132. The voltage output v(t) of the coil 102 may be input to the second device 106 to perform the signal processing algorithms explained below, and also to extract and analyze data stored in the relay memory 126. The second device 106 may optionally include an interface, display, and communications module for advanced functionality and user interaction as desired. The second device 106 may be, for example, another relay device, a laptop computer, a desktop computer or a workstation, or other electronic device having signal input, output and processing capabilities.

The protective device 108 is operatively connected to the relay 104 and is responsive thereto. The protective device 108 may be a circuit breaker, interrupter, switching element, or other circuit protection element for interrupting the measured current i(t) in the conductor 116 when fault conditions are detected, thereby preventing damage to equipment associated with the conductor 116.

II. Current Transformers Versus Rogowski Coils

Figure 2:
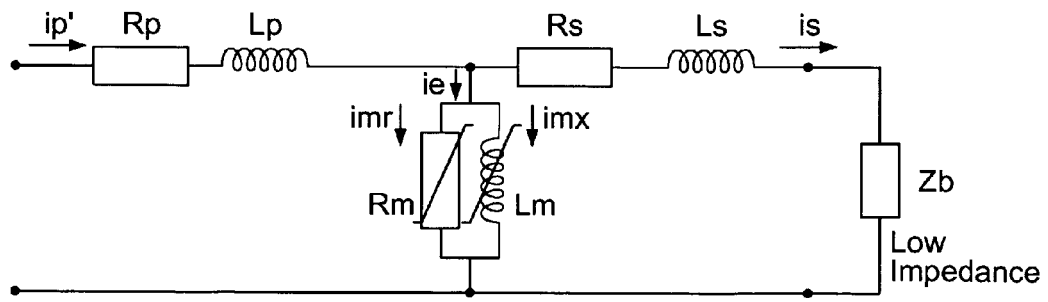
FIG. 2 illustrates a conventional iron-core current transformer equivalent circuit.

Historically, current transformers have been used for protection and measurement purposes of operating conditions in an electrical power system, and such transformers are prevalent in existing systems. FIG. 2 illustrates an equivalent circuit of a conventional iron-core current transformer (CT) that is commonly found in existing medium and high voltage electrical systems. The CT impedance $Z_b$, sometimes referred to as the CT burden, has a low value and the secondary current $i_s$ of the transformer is nearly in phase with the primary current $i_p$. However, due to a non-linear magnetizing branch, the secondary current $i_s$ may be distorted if the CT saturates. If the secondary current $i_s$ is being used for measurement purposes, distortion of the secondary current $i_s$ may compromise proper operation of a protective device associated with the CT.

Figure 3:
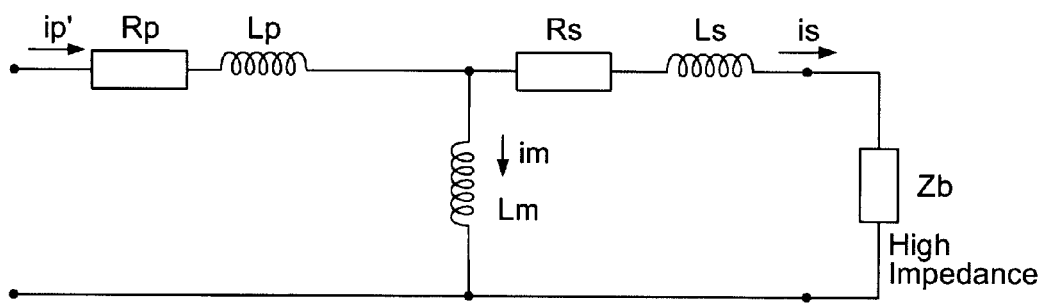
FIG. 3 illustrates a Rogowski coil equivalent circuit.
Figure 4:
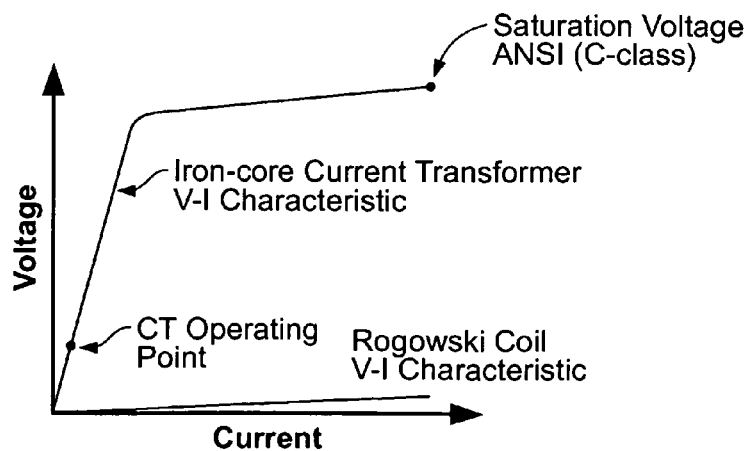
FIG. 4 is a comparison graph of voltage and current characteristics of the circuits shown in FIGS. 2 and 3.

FIG. 3 illustrates an equivalent circuit of the Rogowski coil 102 shown in FIG. 1. In contrast to the CT circuit shown in FIG. 2, the burden $Z_b$ of the Rogowski coil 102 has a high value so the coil output voltage $V_g$ is shifted in phase nearly 90° relative to the measured current $i_p$ and is proportional to the rate of change of measured current (di/dt) enclosed by the coil. Also in contrast to the CT circuit of FIG. 2, the Rogowski coil magnetizing branch is linear and the Rogowski coil secondary signal $i_s$ is not distorted. Comparison of CT and Rogowski coil voltage/current characteristics is shown in FIG. 4, demonstrating the linearity of the Rogowski coil 102 and the non-linearity of the CT. Because of the linearity of the Rogowski coil 102 and its lower susceptibility to signal distortion, the Rogowski coil 102 is generally preferable to CTs for measurement and protection purposes.

Referring back to FIG. 1, the voltage v(t) induced in the windings 110 of the Rogowski coil 102 is governed by the following Equation:

$$v(t) = -\mu_o\mu_r nS \frac{di(t)}{dt} = -M\frac{di(t)}{dt} \quad (1)$$

where $\mu_o$ is the magnetic permeability of free space, $\mu_r$ is the relative permeability (the ratio of the permeability of the coil 102 to the permeability of free space $\mu_o$), n is the winding density (turns per unit length), S is the cross sectional area of the core 104 in the Rogowski coil, and M represents the mutual reactance or mutual coupling between the coil windings 110 and the conductor 116.

For an ideal Rogowski coil 102, M is independent of the location of the conductor 116 within the opening 114. As is evident from Equation 1, the Rogowski coil output voltage v(t) is proportional to the rate of change of the measured current i(t). To obtain signals proportional to the measured current i(t), the integral of the output voltage v(t) of the Rogowski coil 100 may be mathematically computed or otherwise determined, referred to herein as integration of the voltage signal, in a known manner. Conventionally, such integration may be performed, for example, at a location remote from the coil 102 (using known analog circuitry or digital signal processing techniques) or immediately at the coil location with an integrating circuit or other device. In a conventional protective relay system, integration of Equation (1) is represented by the following relationship:

$$v(t) = \frac{M}{R_i C_i} i(t) \quad (2)$$

where $R_i$ and $C_i$ in Equation 2 represent an integrating resistor and capacitor.

If the measurement of the current i(t) is restricted to a single sinusoidal current at a given frequency ω (e.g., 50 or 60 Hz), the coil output voltage v(t) will have a root mean square (RMS) value defined by Equation 3 and a phase shift nearly 90° versus the measured current i(t).

$$Vrms = M\omega\sqrt{2}Irms \quad (3).$$

Figure 5A:
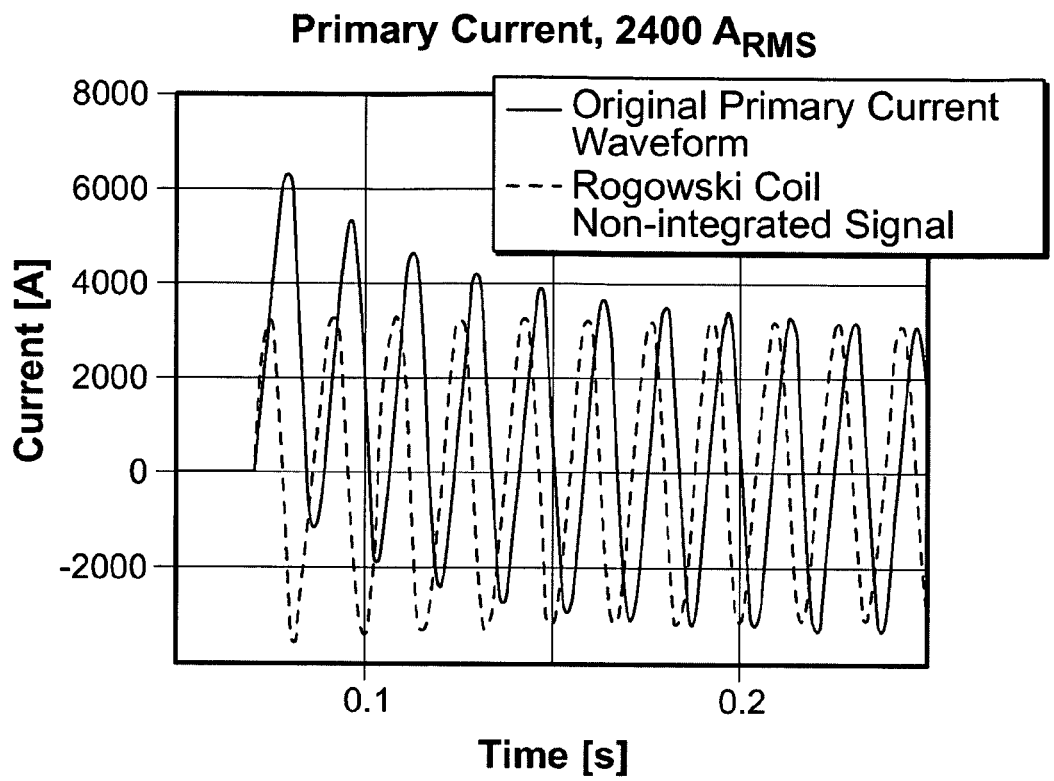
FIG. 5A illustrates waveforms of an original current waveform and a secondary Rogowski coil waveform according to the system of the present invention.
Figure 5B:
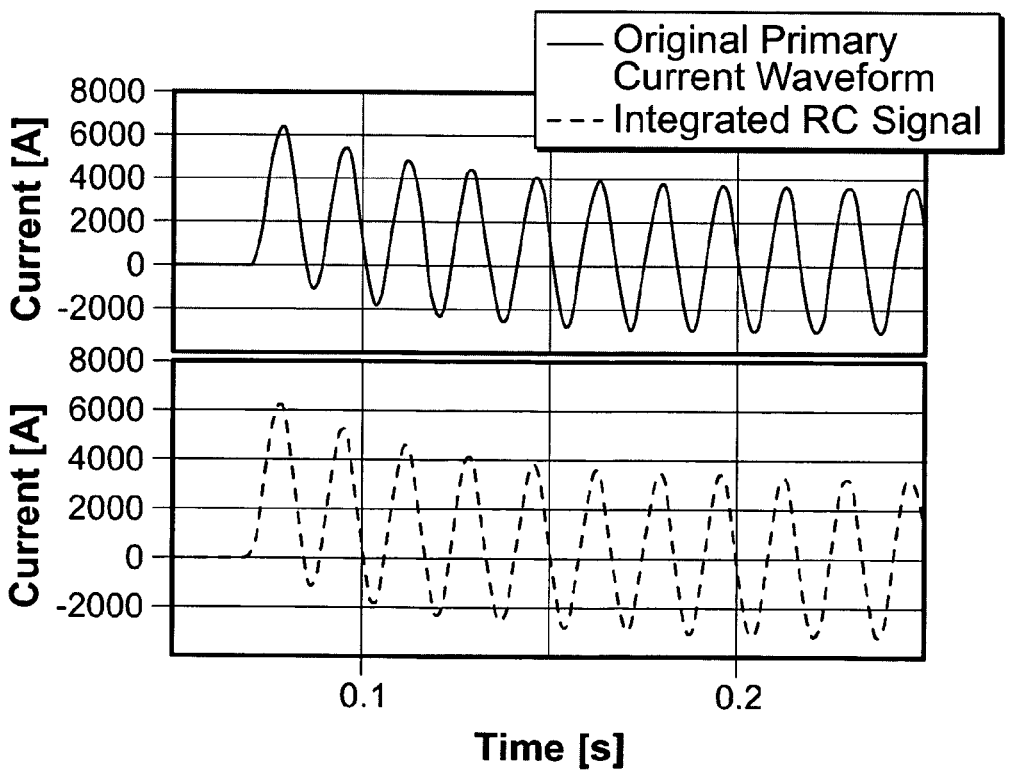
FIG. 5B illustrates waveforms of an original current waveform and a Rogowski coil waveform of a conventional relay system.

FIG. 5a shows Rogowski coil output signals before and after integration of the output signals. As FIG. 5a shows, the integrated and non-integrated signals are noticeably different. However, FIG. 5b illustrates that the integrated signal accurately reproduces the waveform of the measured current in the conductor 116 (indicated as original primary current waveform in FIG. 5b) recorded by a laboratory current sensor, and for this reason the integrated signal has been adopted and conventionally utilized in protective relay systems.

Figure 6:
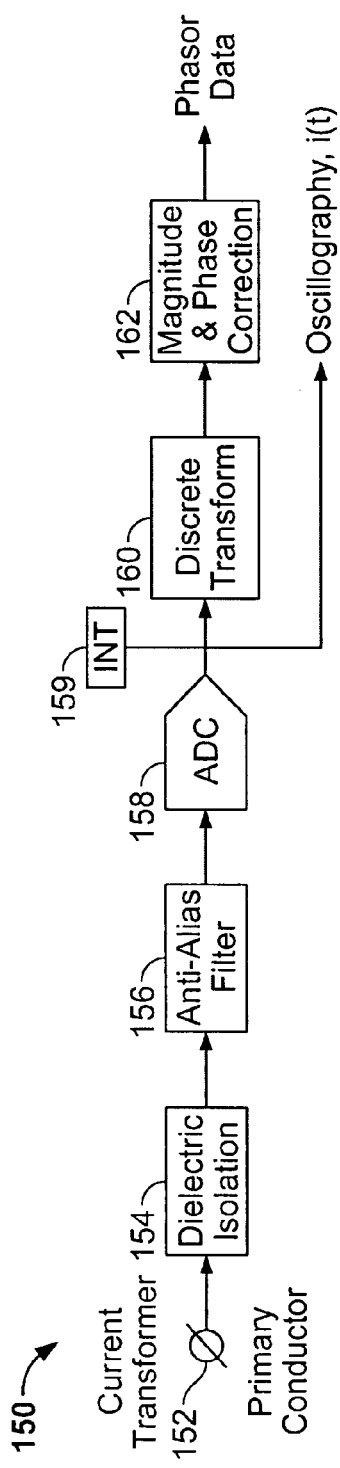
FIG. 6 illustrates a data acquisition and processing block for a conventional relay system.

FIG. 6 is a block diagram of a data acquisition system 150 illustrating an analog signal flow from a conventional current transformer 152 into a conventional digital protective relay The system 150 includes a dielectric isolation element 154, an anti-alias filtering element 156, and an analog-to-digital converter 158. Upon conversion to digital values, raw sample data is available to the relay logic. However, phasor-based protective relays require further signal processing to extract the power frequency signal in the form of a complex phasor having root mean square magnitude and phase angle to adequately represent the original signal (primary current $i_p$). As noted above, the Rogowski coil output signal v(t) is a scaled time derivative di/dt of the primary current $i_p$. To use such signals with phasor-based protective relays, signal processing is required to extract the power frequency signal. This is typically achieved by integration 159 of the Rogowski coil output signal. As explained above, however, integration of the Rogowski coil output signal is not without difficulties. Complex analog or digital filters and/or signal processing techniques are typically required to integrate the output of Rogowski coils, increasing the cost of such systems and introducing errors at low frequencies and potential reliability issues.

One method commonly used to obtain the fundamental complex phasor value is to apply a discrete transform 160 to the raw sample data stream. As this transform represents a complete family of mathematical transforms there are multiple possible specific implementations which yield acceptable complex phasor outputs. Within the relay logic, it is also common to represent power system events as time-based oscillography, along with the corresponding actions determined by the logic (event recording). Such oscillography commonly utilizes the raw samples of the input signals, as well as the digitally filtered fundamental waveforms. These event recordings provide useful information to one skilled in the art of power systems analysis.

When the analog signal input to the sampling system is a linear scaled function of the original signal such as primary current i(t) measured by a current transformer, it is commonly only necessary to effect a magnitude correction 162 as a scalar multiplier to the resultant complex phasor. This magnitude correction may be performed to compensate for the scalar transformations between the original signal and the numerical output of the discrete transform. Thus, the resultant re-scaled complex phasor may be represented within the protective relay software in preferentially advantageous units.

III. Derivation of Inventive Operating Principles

Figure 7:
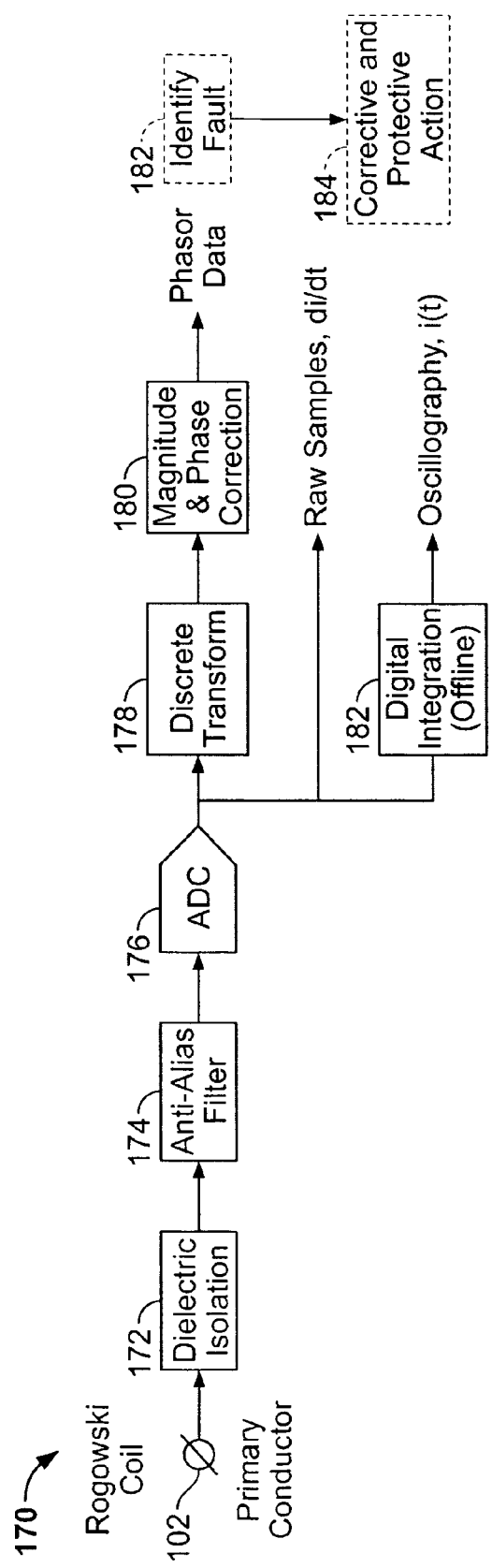
FIG. 7 illustrates a data acquisition and processing block for a relay system according to the present invention.

Unlike the previously described data acquisition system 150 shown in FIG. 6 that requires integration of the raw data to provide useful data for the relay to make control decisions, a block diagram of a data acquisition system 170 according to the present invention is shown in FIG. 7. Notably, the system of FIG. 7 does not utilize integration of the raw sample data stream, but rather provides a non-integrated Rogowski coil output signal that is used to determine the primary current flow $i_p$ in a conductor 116 (FIG. 1) that is detected by the Rogowski coil 102. A simpler yet highly reliable system is therefore provided.

FIG. 7 illustrates an analog signal flow from the Rogowski coil 102 into the protective relay device 104. The system 170 includes a dielectric isolation element 172, an anti-alias filtering element 174, and an analog-to-digital converter 176. Thus, the raw data stream for the output voltage of the Rogowski coil 102 is digitized. Instead of integrating the raw data stream signal in the time domain as in conventional systems, the present invention utilizes signal processing in the frequency domain without integration of the signal. That is, in the system 170, signal processing and corrections for both the magnitude and phase angle of the Rogowski coil output signal that are frequency dependent is performed. Theory of the frequency domain will now be explained.

The Rogowski coil output voltage with respect to the primary current is given by Equation 1, which can also be represented as follows.

$$V(s) = -sMI(s) \qquad (4a)$$

Recognizing that s is the Laplace operator $j\omega$ in the frequency domain then Equation 4a may further be rewritten as $$V(j\omega) = -j\omega MI(j\omega) \qquad (4b).$$

To obtain the complex frequency representation of the measured primary current $i_p$ that induces the voltage in the Rogowski coil 102, it is necessary to perform a division in the frequency domain.

$$I(j\omega) = -\frac{V(j\omega)}{j\omega M} \qquad (5)$$

The complex number $V(j\omega_n)$ is the output of the discrete cosine transform for the frequency of interest, $\omega_n$. When represented in single-frequency phasor form, the formula for calculating the primary current reduces to Equation 6:

$$\vec{I} = -\frac{\vec{V}}{jM} \Rightarrow I_n \angle \theta = \frac{V \angle (\theta - 90°)}{M} \qquad (6)$$

The scalar M of the Rogowski coil 102 may be advantageously determined at the fundamental power frequency, e.g. 60 Hz, and once the value of M is known, it may be used as a scalar multiplier to the voltage signal to determine the current according to Equation 6. In order to obtain properly scaled values of the original signal having an nth harmonic component of the fundamental frequency, it is necessary to incorporate the harmonic order n into Equation 6 as given by Equation 7

$$\vec{I_n} = -\frac{\vec{V_n}}{jnM} \Rightarrow I_n \angle \theta = \frac{V_n \angle (\theta - 90°)}{nM}. \qquad (7)$$

Equations 6 and 7 show that the Rogowski coil secondary signal is a voltage proportional to the primary current shifted 90°. Thus, for purposes of the present invention, the Rogowski coil secondary signal phase shift and scalar magnitude correction in the frequency domain may be utilized for making control decisions. By utilizing processing techniques in the frequency domain rather than in the time domain as conventionally employed, complex analog or digital filters in the time domain needed to integrate the signal are avoided, together with associated expense. By avoiding integration of the signal, reduced processing demands are experienced in the relay 104 and/or the external device 106 (FIG. 1). Faster computing times are therefore possible in comparison to known systems.

The signal flow chart of FIG. 7 is summarized by Equations 8a and 8b.

$$I \angle \theta \xrightarrow{\text{Rogowski Coil}} v(t) \xrightarrow{\text{Digitizer}} v(n) \xrightarrow{\text{Digital Fourier Transform}} V \angle (\theta - 90°) \qquad (8a)$$

$$V \angle (\theta - 90°) \xrightarrow{\text{Correction}} \frac{V \angle (\theta - 90° + 90°)}{M} = I \angle \theta. \qquad (8b)$$

Briefly, the measured primary current $i_p(t)$ (shown in FIG. 1) in the conductor 116 passing through the Rogowski coil 102 is represented in the frequency domain as $I \angle \theta$ translated by the Rogowski coil to v(t), which is a scaled time derivative of $i_p(t)$. The output signal v(t) of the coil 102 is digitized and processed through a known discrete transform algorithm, such as a Fourier Transform in one example, to determine the complex number representation of its one or more constituent frequency components. The one or more frequency components of interest, represented by the complex number output of the discrete transform algorithm 178, are then modified by scalar multiplication and 90° phase shift 180 to obtain frequency domain representations of the original measured current $i_p(t)$. In one example $i_p(t)$ may correspond to a sensed current in a primary winding of a current transformer, although other applications are contemplated as well.

Traditionally, when using current transformers, or when performing integration of the Rogowski coil output signals inside the relay, event recording can provide true representation of the primary current waveform I(t). However, when using non-integrated signals from the Rogowski coil as described above, oscillographic recordings may provide the di/dt signals, but not readily utilized I(t) signals of the primary current. However, the di/dt raw sample data may be stored in the relay memory 126 (FIG. 1), and event recording viewing may be performed offline at a location remote from the relay device 104 with another device 106 (FIG. 1). Integration functions 182 on the raw sample data may also be run offline as desired to extract I(t) waveforms without burdening the relay device 104 with integration of the signal and necessary computations. Event recording software may be provided that includes integration of the Rogowski coil non-integrated signals as well as additional algorithms for final analysis, which may be run offline.

Using the system 170 shown in FIG. 7, the relay 104 may make control decisions based upon non-integrated signals from the Rogowski coil—102. Specifically, based upon the phasor data obtained from the non-integrated Rogowski coil signal, a true representation of the current flow in the conductor 116 (FIG. 1) may be provided. Once the representation of the current flow is obtained, the relay may identify fault conditions 182 in the conductor 116 (FIG. 1) being monitored with the Rogowski coil 102 in a known manner. When fault conditions are identified, the relay device 104 may take appropriate corrective and protective action 184, such as communicating with other devices and systems via the communications module 128 (FIG. 1) and causing the protective device 108 (FIG. 1) to interrupt the current path being monitored with the Rogowski coil 102 to protect associated equipment from damage.

Having now explained the theory and operating principles of the invention, it is believed that the data acquisition system 170 may be implemented using conventional programming techniques that are within the purview of those in the art. Further explanation of associated algorithms, methods and techniques associated with such programming is not believed to be necessary. Such programs, methods and techniques may be executable by the microprocessor based relay device 104 and/or the secondary device 106.

IV. Validating Examples

Effectiveness of the inventive signal processing of the present invention, that avoids integration of signals in the time domain and instead processes signals in the frequency domain, has been tested and verified as will now be explained.

Figure 8A:
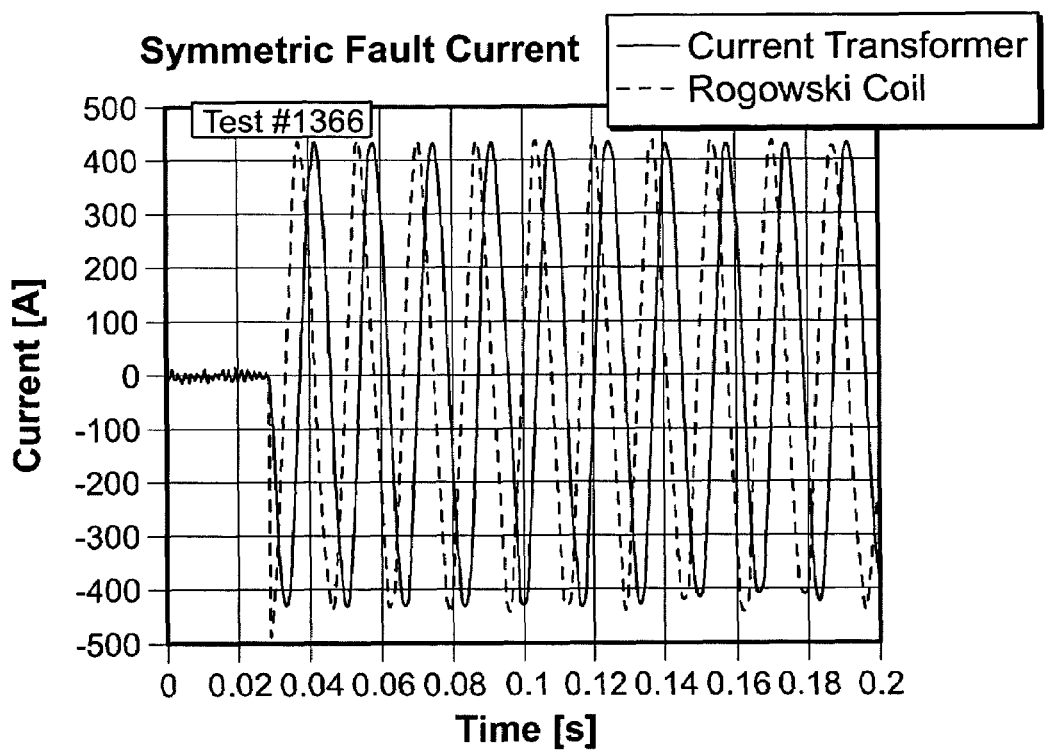
FIG. 8A is an example waveform graph of a processed coil signal according to the present invention versus a conventional system in a symmetrical current fault condition.
Figure 8B:
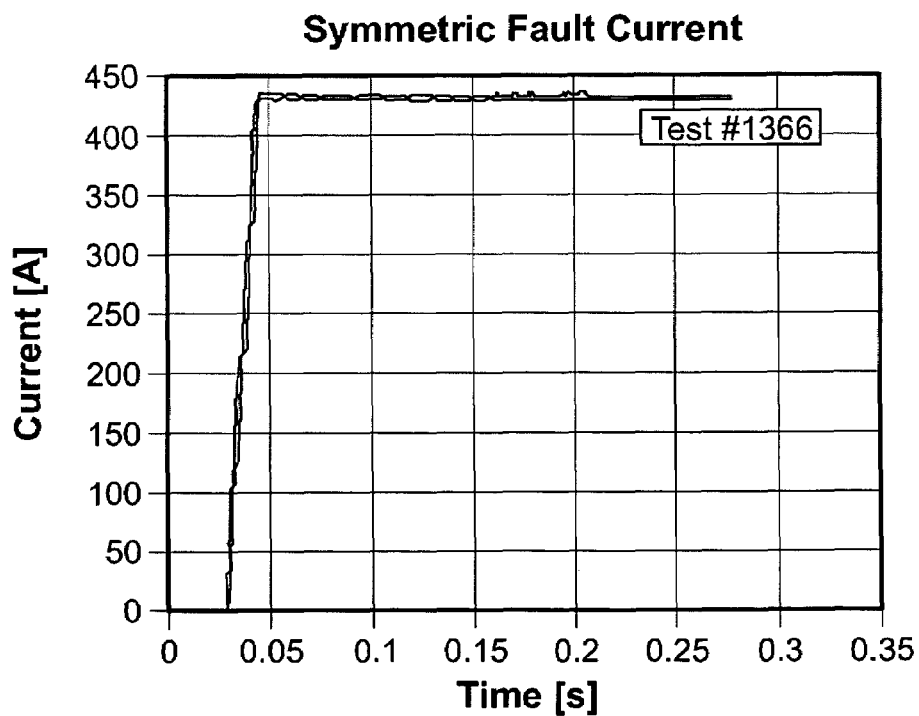
FIG. 8B is an example comparison root mean square current graph of processed signal according to the present invention and a test signal representing a symmetrical current fault condition.
Figure 8C:
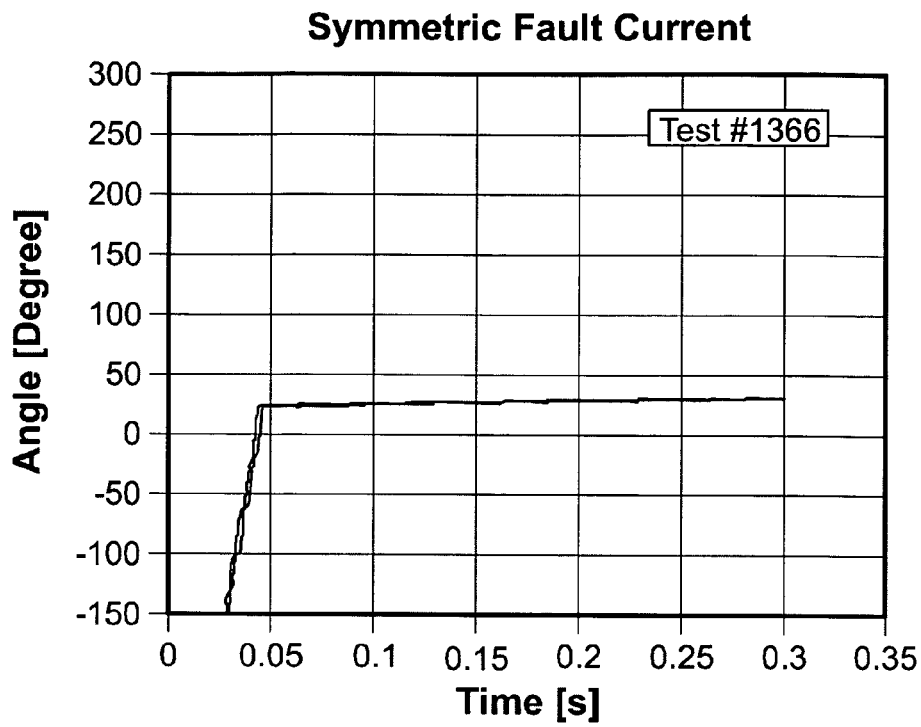
FIG. 8C is an example phase angle difference graph of a processed coil signal according to the present invention and a test signal representing a symmetrical current fault condition.

FIG. 8A illustrates a symmetrical primary current and the Rogowski coil secondary signal shifted 90° compared to the primary current. Calculated RMS values for primary current and the RC secondary signal scaled to the primary are nearly identical after one cycle needed for phasor estimation algorithm to reach full accuracy (FIG. 8B). When the Rogowski coil phase angle of the secondary signal is digitally shifted 90°, the phase angle difference between the primary current and the Rogowski coil secondary signal becomes nearly zero (FIG. 8C).

Figure 9A:
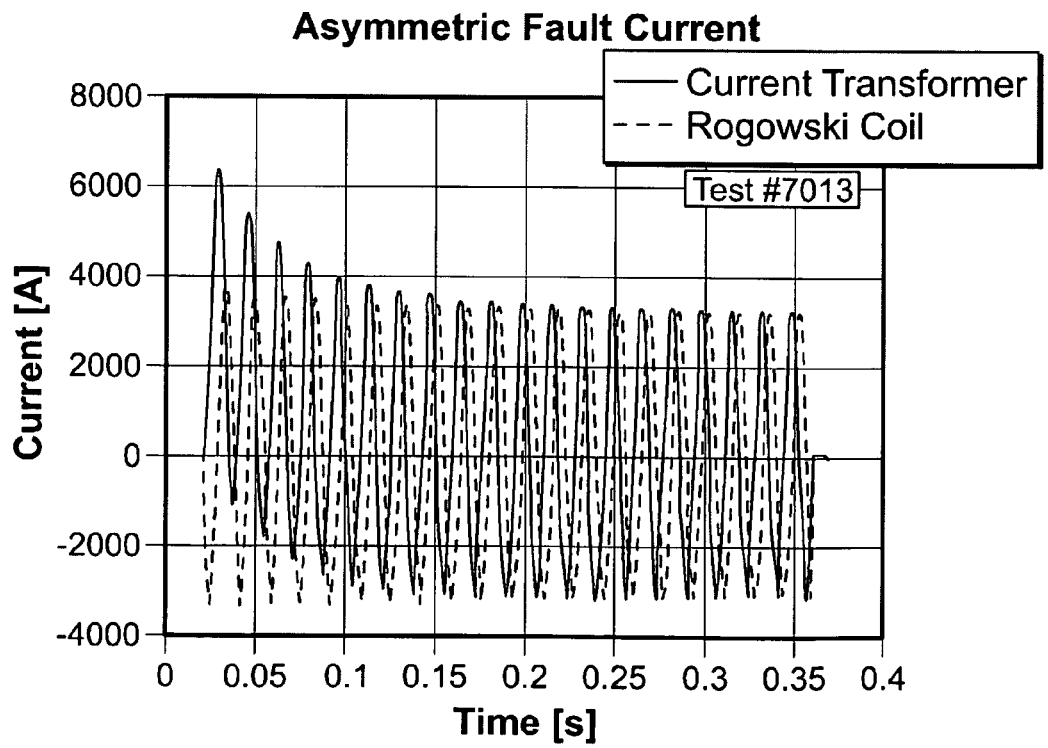
FIG. 9A is an example waveform graph of a processed coil signal according to the present invention versus a test signal representing an asymmetrical current fault condition.
Figure 9B:
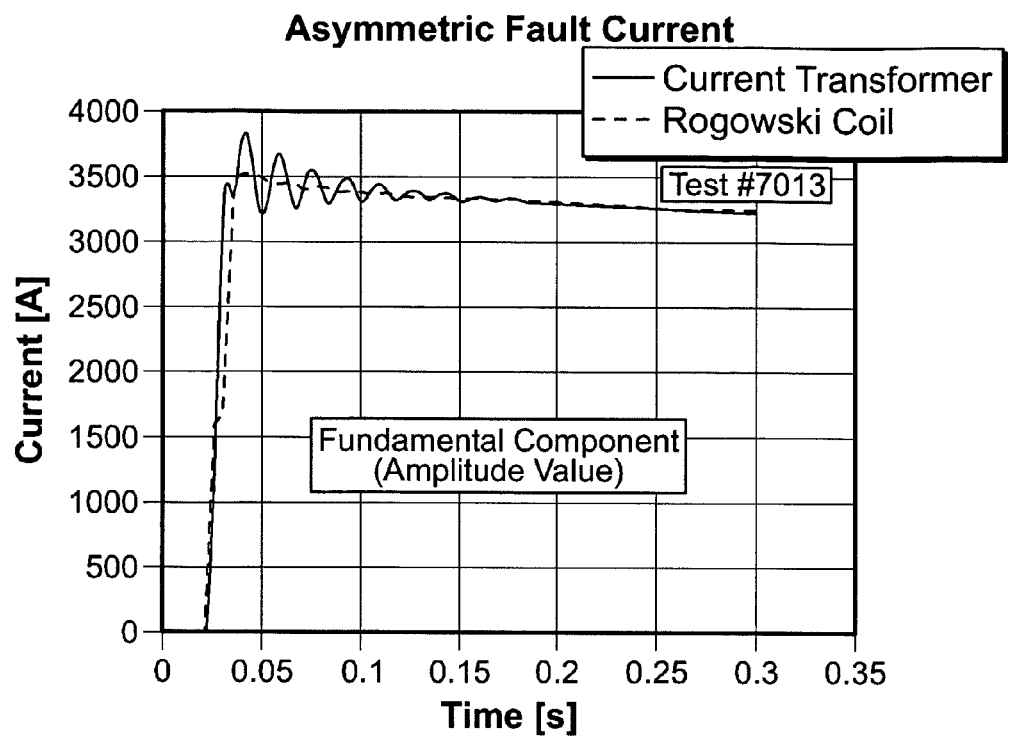
FIG. 9B is an example comparison root mean square current versus of a processed signal according to the present invention a test signal representing an asymmetrical current fault condition.
Figure 9C:
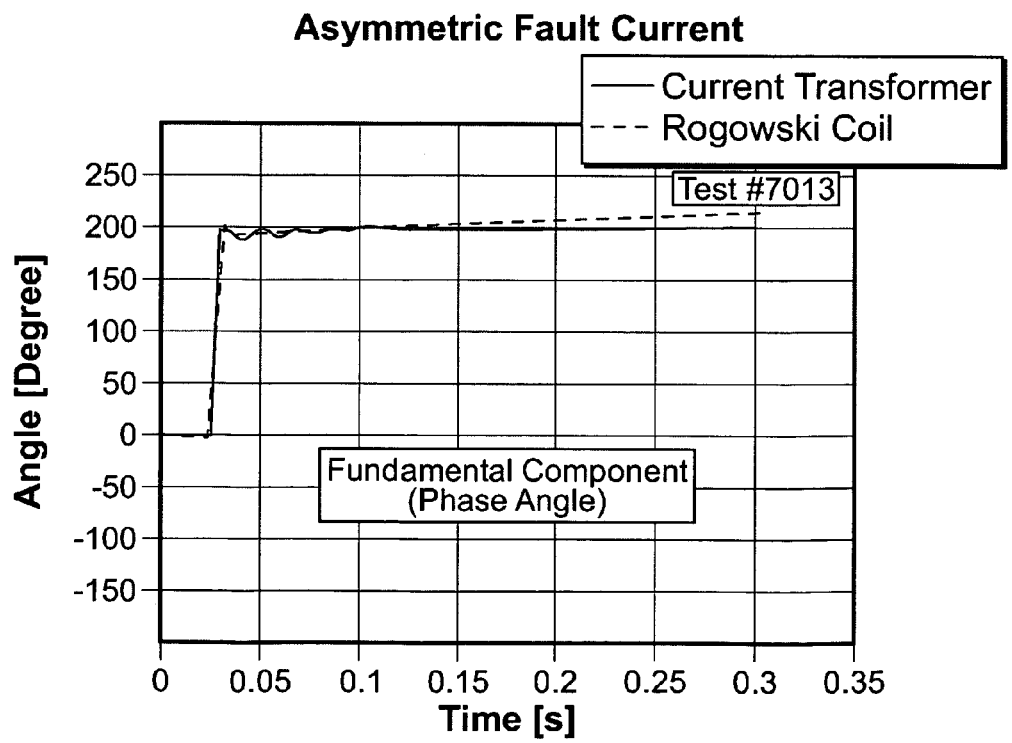
FIG. 9C is an example phase angle difference graph of a processed signal according to the present invention and a test signal representing asymmetrical current fault condition.

FIG. 9A shows primary current and the Rogowski coil secondary signal for asymmetrical current faults. As expected, the Rogowski coil secondary signal waveform differs from the primary current waveform since the DC component is attenuated and the signal is also shifted 90° However, calculated RMS values for primary current and the Rogowski coil secondary signal scaled to the primary become nearly identical after DC component attenuates in the primary current (FIG. 9B). The phase angle difference between the primary current and the Rogowski coil secondary signal digitally shifted 90° becomes nearly zero (FIG. 9c).

Figure 10A:
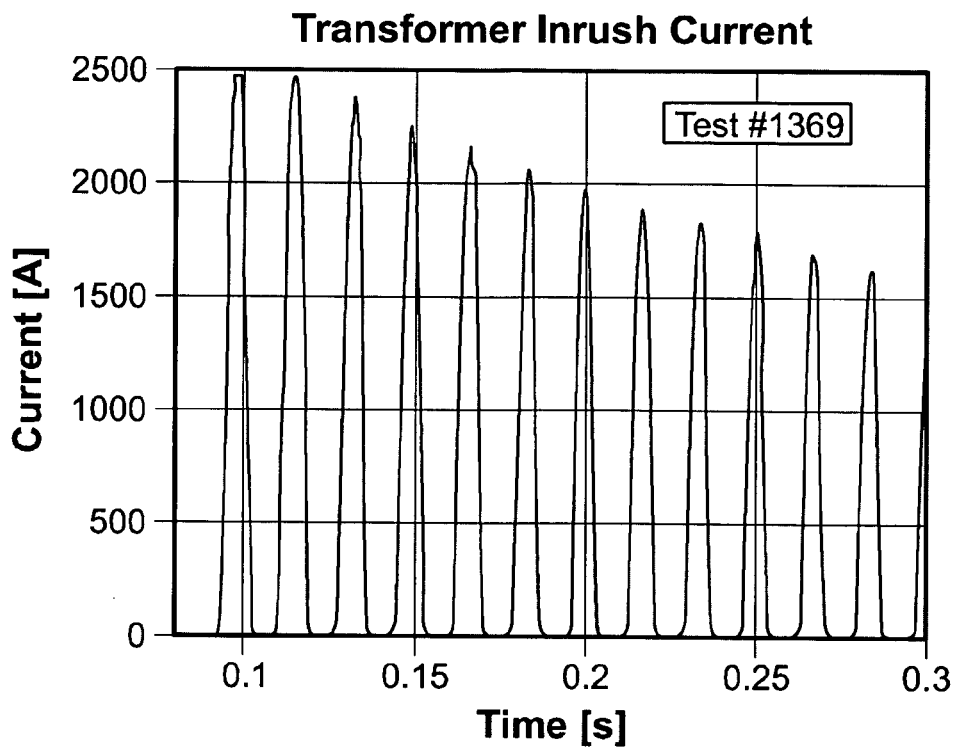
FIG. 10A is an example waveform chart of a test signal representing a transformer inrush current.
Figure 10B:
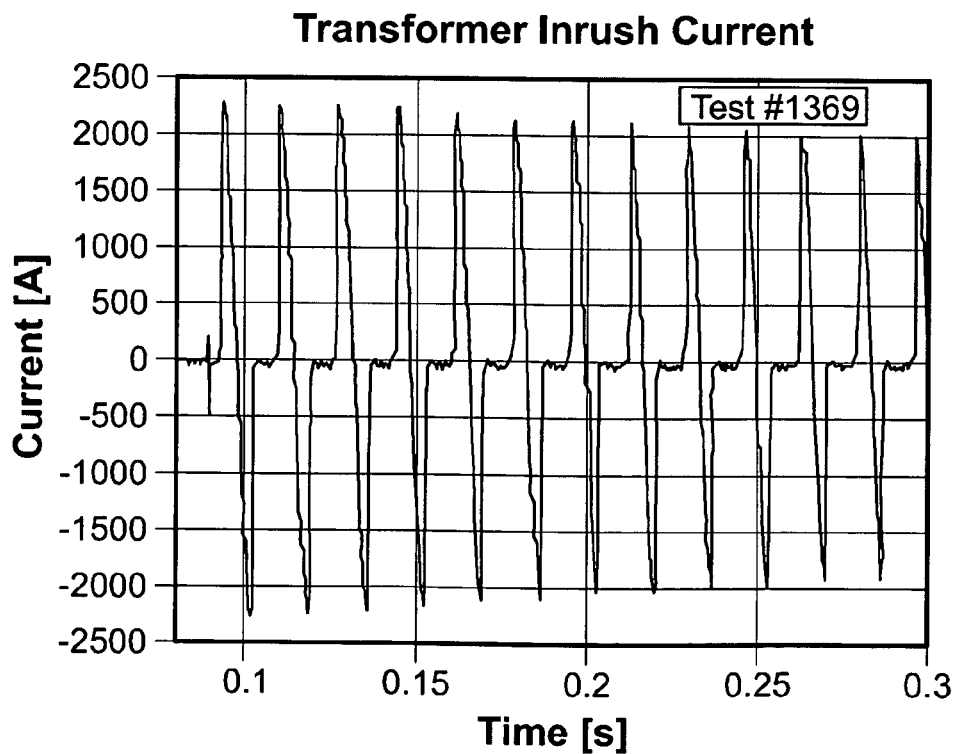
FIG. 10B is an example Rogowski coil secondary signal for the test signal shown in FIG. 10A.
Figure 10C:
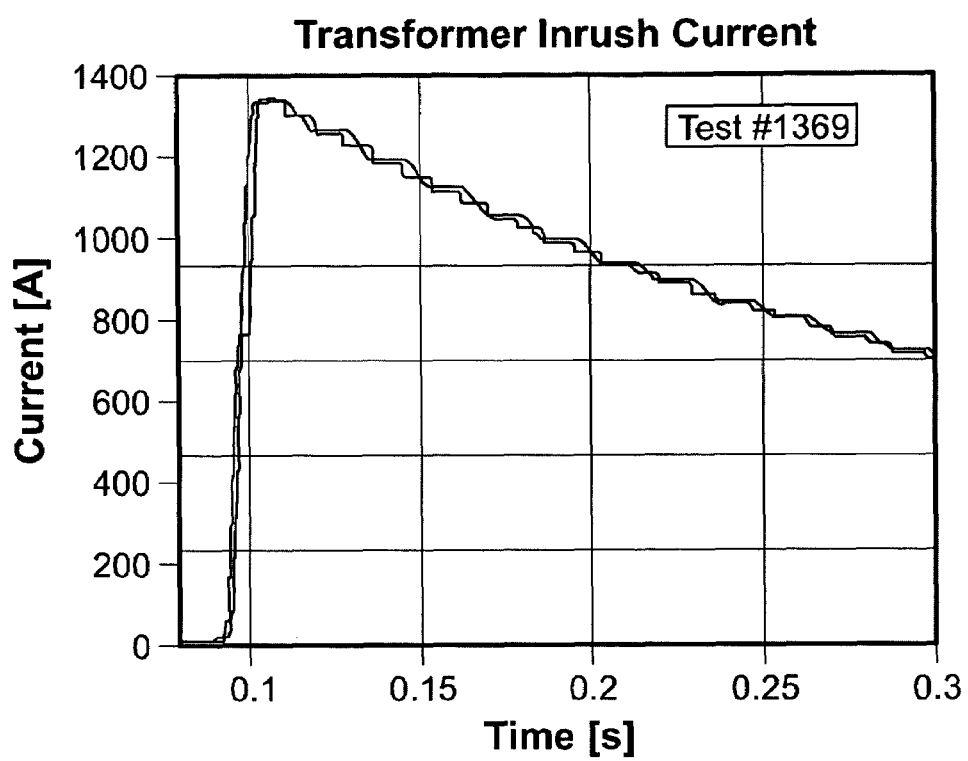
FIG. 10C is an example root mean square current graph of a processed coil signal according to the present invention versus the test signal.
Figure 10D:
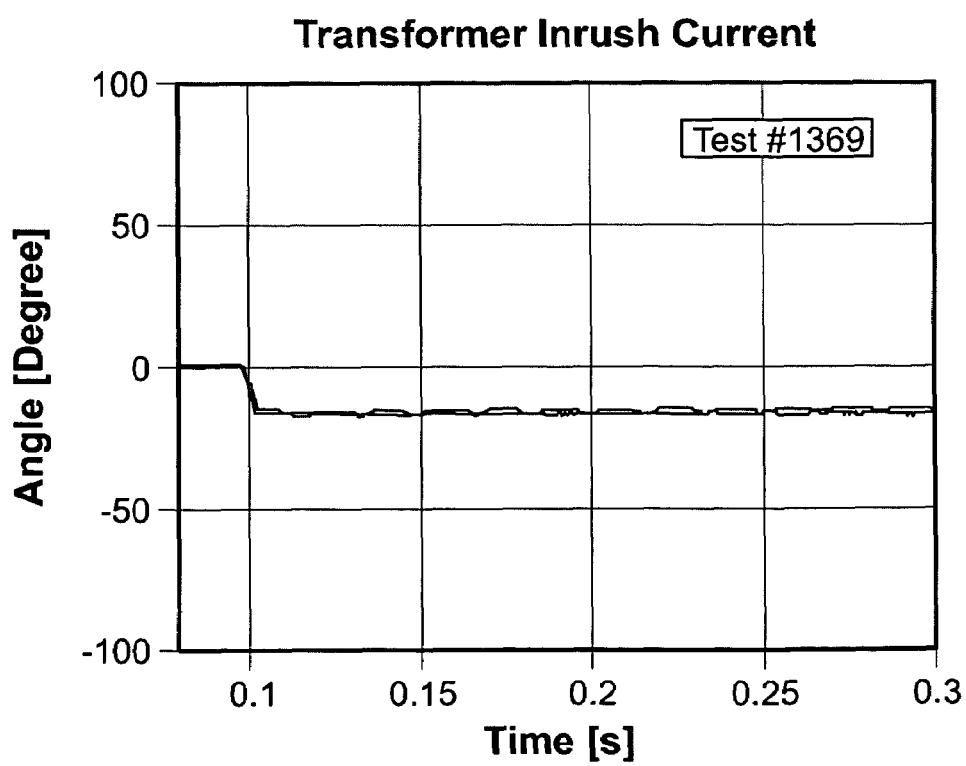
FIG. 10D is an example phase angle difference graph of a processed coil signal according to the present invention versus the test signal.
Figure 10E:
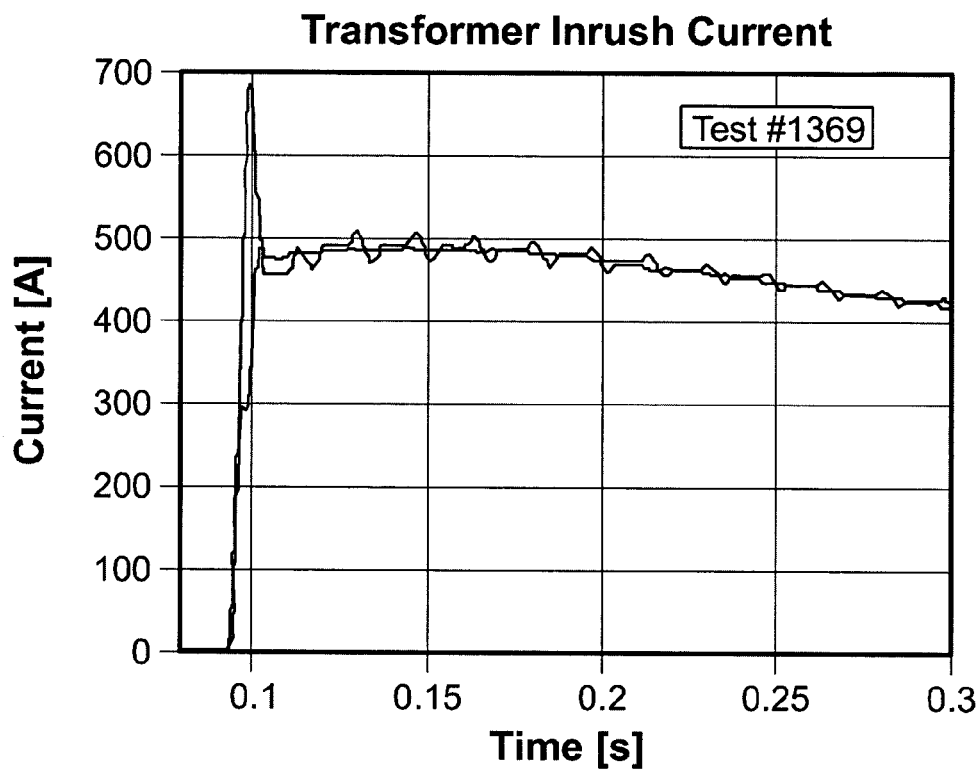
FIG. 10E is an example root mean square current graph of a second harmonic of the processed coil signal according to the present invention versus a second harmonic of the inrush current.
Figure 10F:
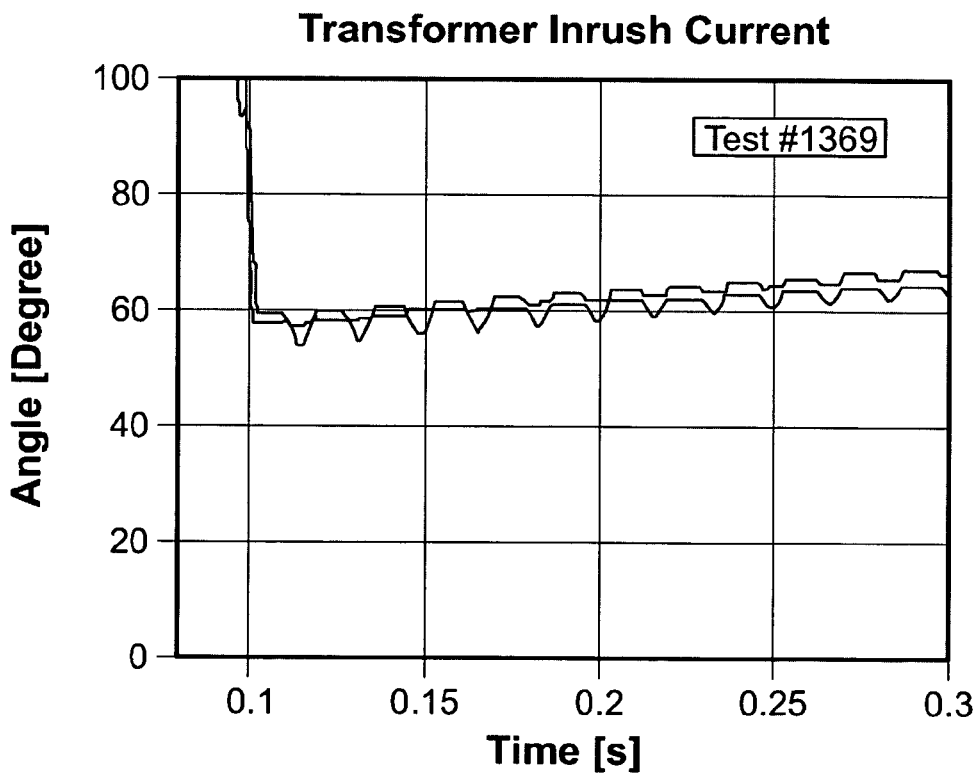
FIG. 10F is an example phase angle difference graph of a processed coil signal according to the present invention versus a second harmonic of the inrush current.

FIGS. 10A and 10B show primary current and the Rogowski coil secondary signal during a transformer energizing. Here again, the Rogowski coil secondary signal waveform differs from the primary current waveform since the primary current contains a large percent of the second harmonic component. However, calculated RMS values for primary current and the Rogowski coil secondary signal scaled to the primary become nearly identical (FIG. 10C). The phase angle difference between the primary current and the Rogowski coil secondary signal digitally shifted 90° is nearly zero (FIG. 10D). During a transformer energizing, the second harmonic component is pronounced and may be used for blocking the protection operation. FIGS. 10E and 10F show that both the amplitude and phase angle of the second harmonic component can be reliably calculated, and both the primary current and the Rogowski coil secondary signal are nearly identical.

Figure 11A:
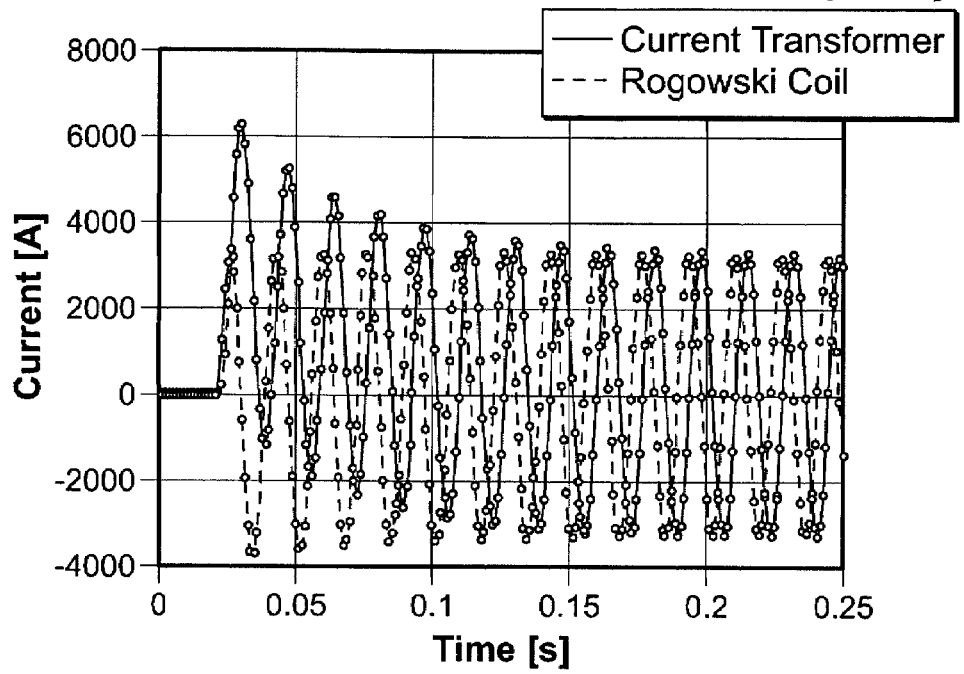
FIG. 11A is an example waveform graph of a processed coil signal according to the present invention versus primary transformer current in an asymmetrical current fault condition.
Figure 11B:
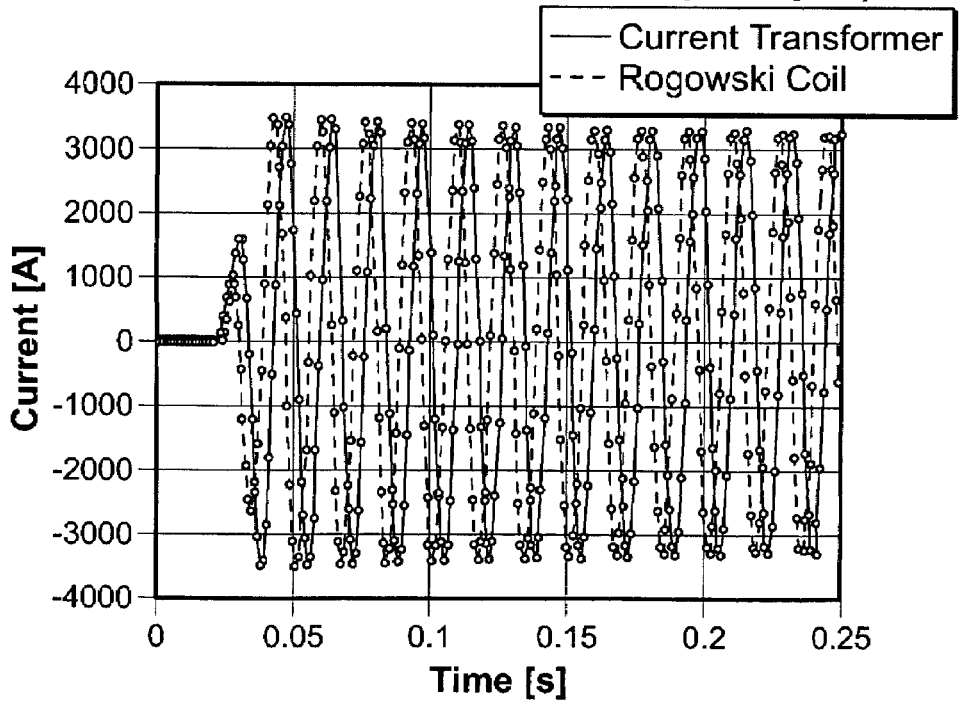
FIG. 11B is an example waveform graph of a pre-processed coil signal according to the present invention versus primary transformer current in an asymmetrical current fault condition.
Figure 11C:
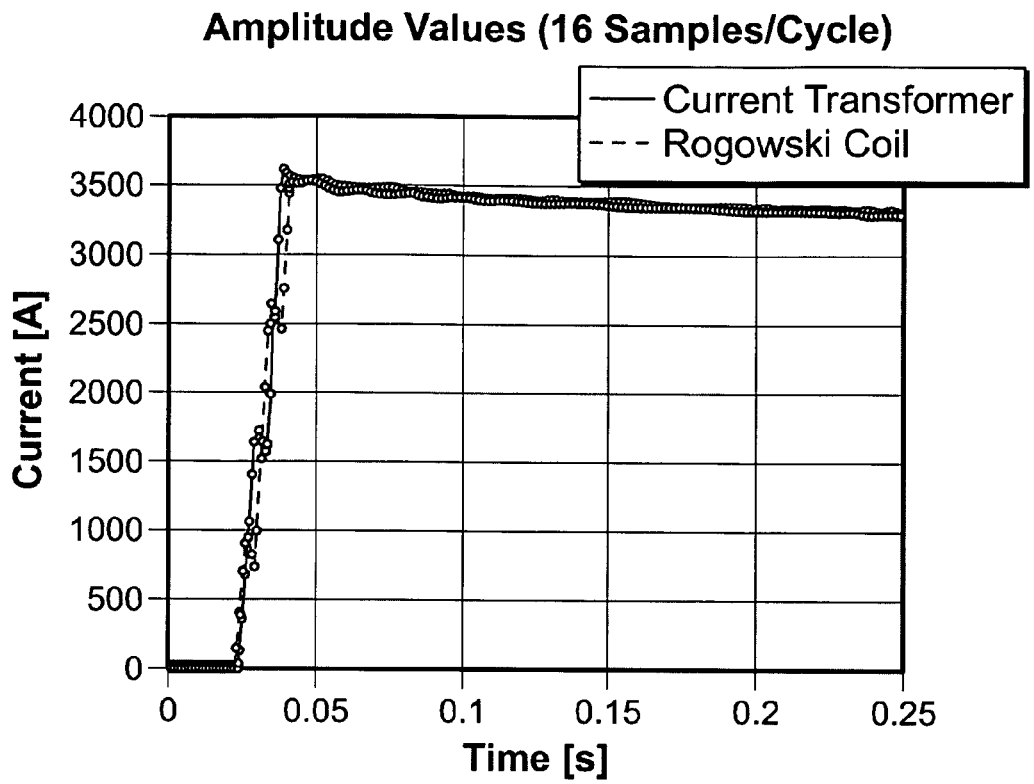
FIG. 11C is an example current root mean square current graph of a processed coil signal according to the present invention versus primary transformer current in an asymmetrical current fault condition.
Figure 11D:
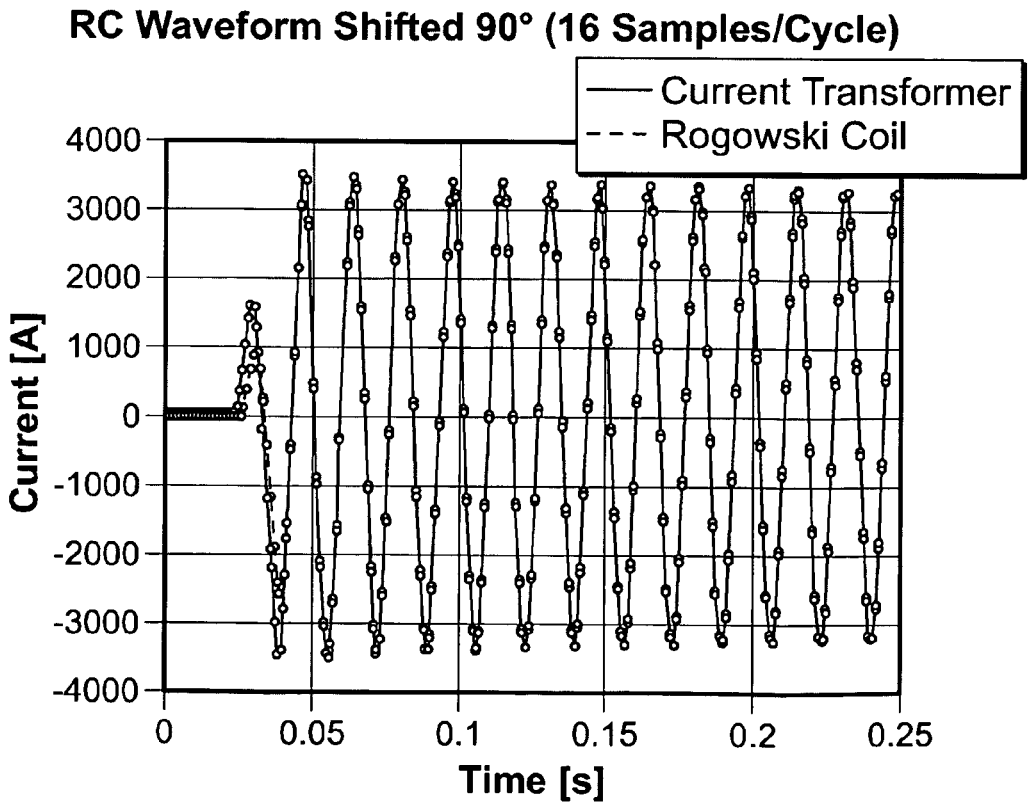
FIG. 11D is an example phase angle difference graph of a processed coil signal according to the present invention versus primary transformer current in an asymmetrical current fault condition.

FIG. 11A shows primary current and the Rogowski coil secondary signal for asymmetrical current faults sampled at 16 samples per cycle in a protective relay system such as that shown in FIG. 1. The DC component of the primary current has been filtered by the relay consistently with FIG. 7. The Rogowski coil secondary signal waveform (before it was shifted 90°) and the primary current waveform are shown in FIG. 11B. Calculated RMS values for primary current and the Rogowski coil secondary signal scaled to the primary are nearly identical (FIG. 11C). The phase angle difference between the primary current and the Rogowski coil secondary signal digitally shifted 90° becomes nearly zero (FIG. 11D).

Figure 12A:
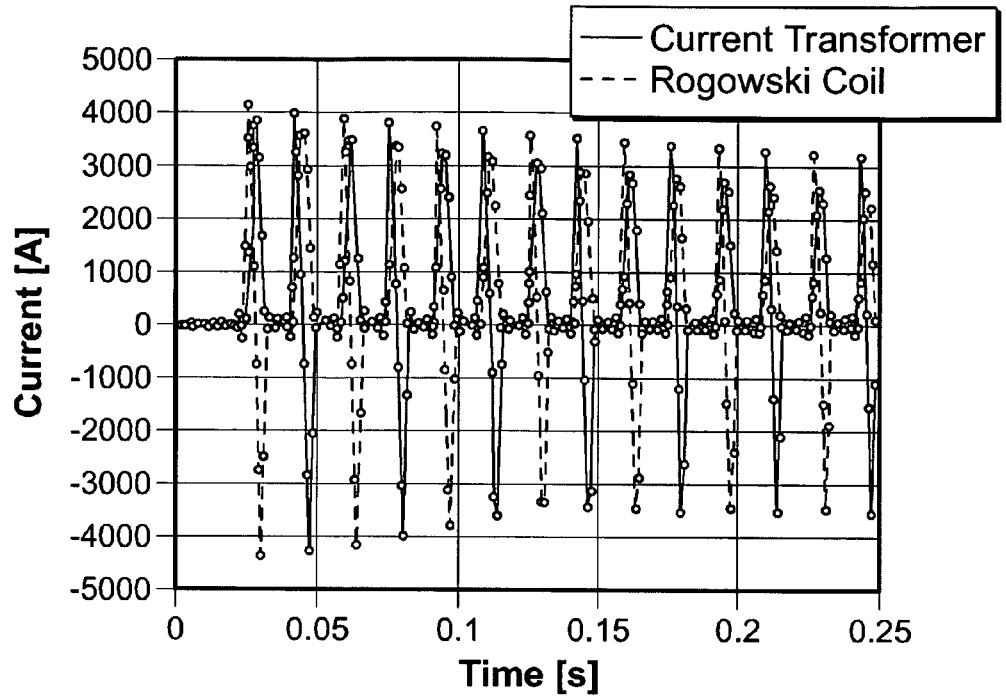
FIG. 12A is an example waveform graph of a transformer inrush current versus a processed coil signal according to the present invention.
Figure 12B:
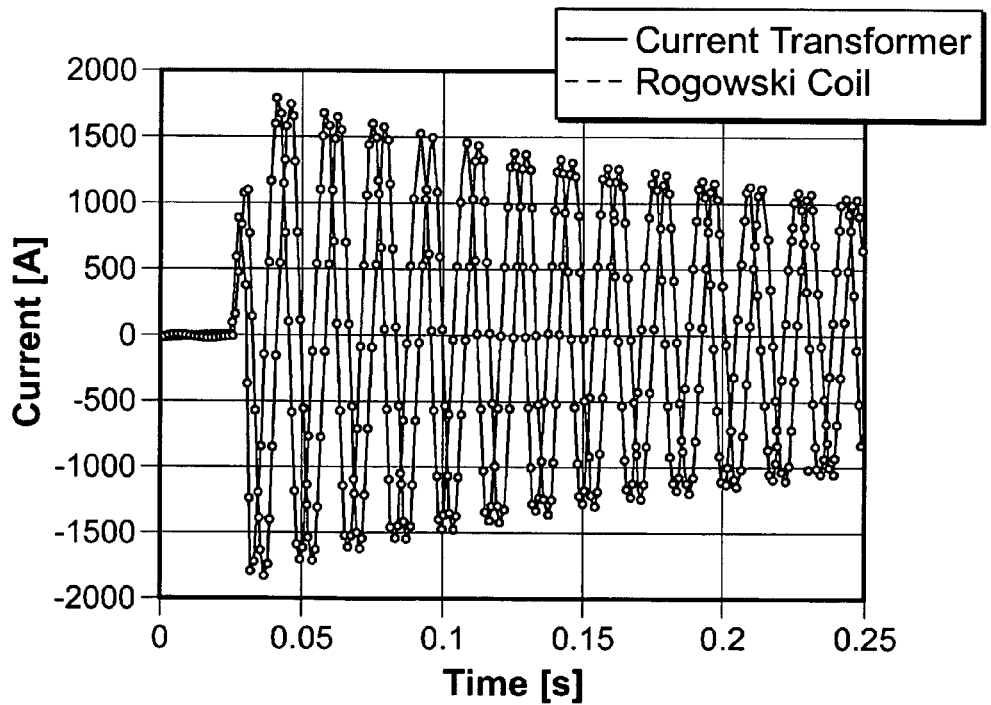
FIG. 12B is an example waveform graph of a pre-processed coil signal according to the present invention versus transformer inrush current.
Figure 12C:
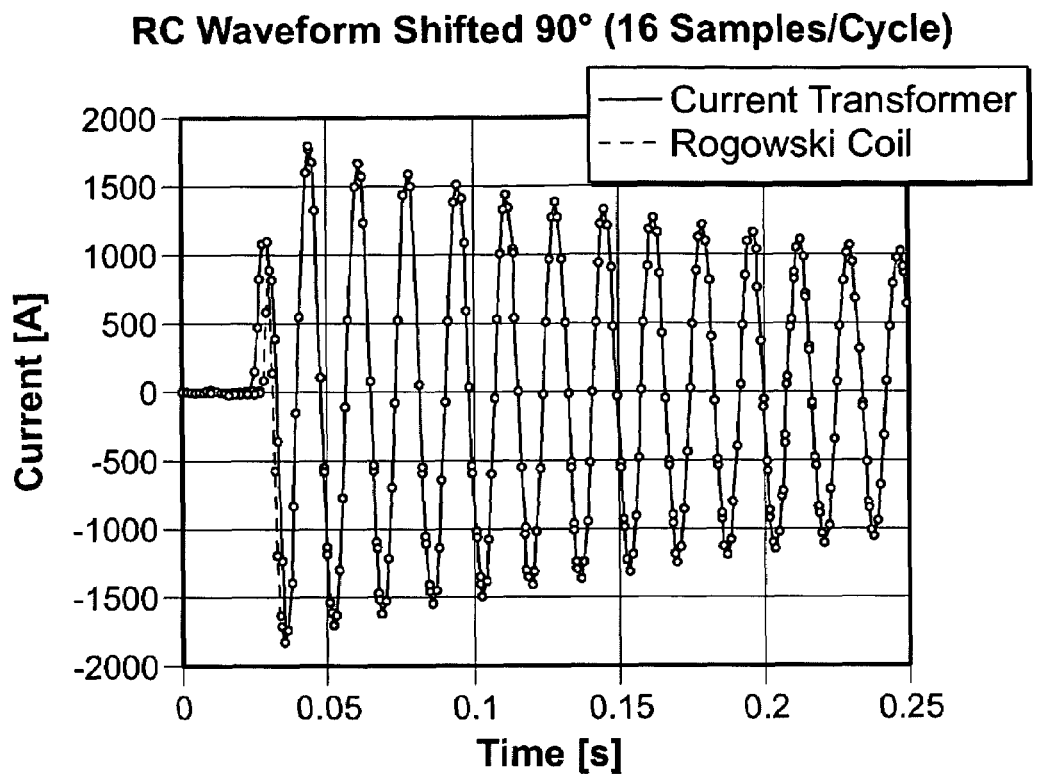
FIG. 12C is digitally shifted coil waveform according to the present invention versus transformer inrush current.
Figure 12D:
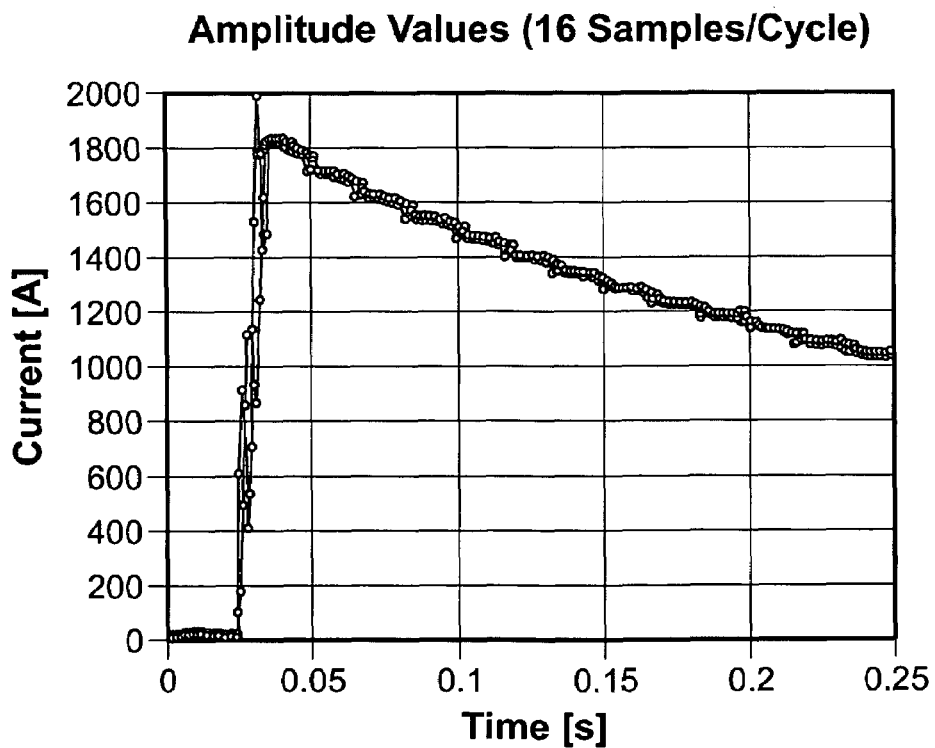
FIG. 12D is an example root mean square current graph of a processed signal according to the present invention versus transformer inrush current.
Figure 12E:
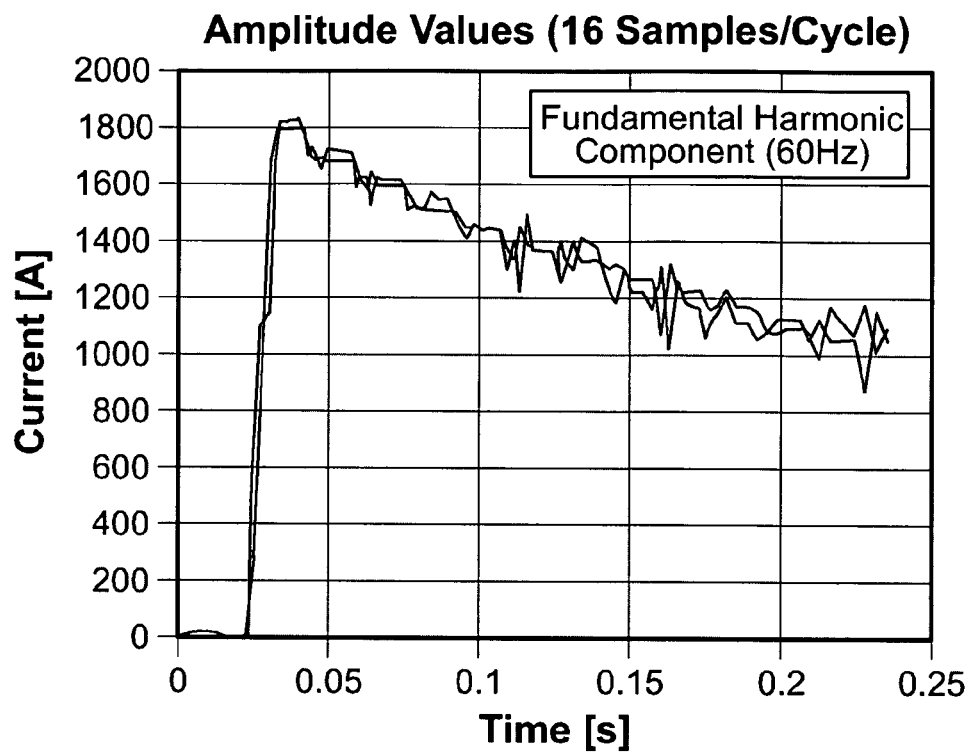
FIG. 12E is a root mean square current graph of a fundamental harmonic of the processed coil signal according to the present invention versus a fundamental harmonic of the transformer inrush current.
Figure 12F:
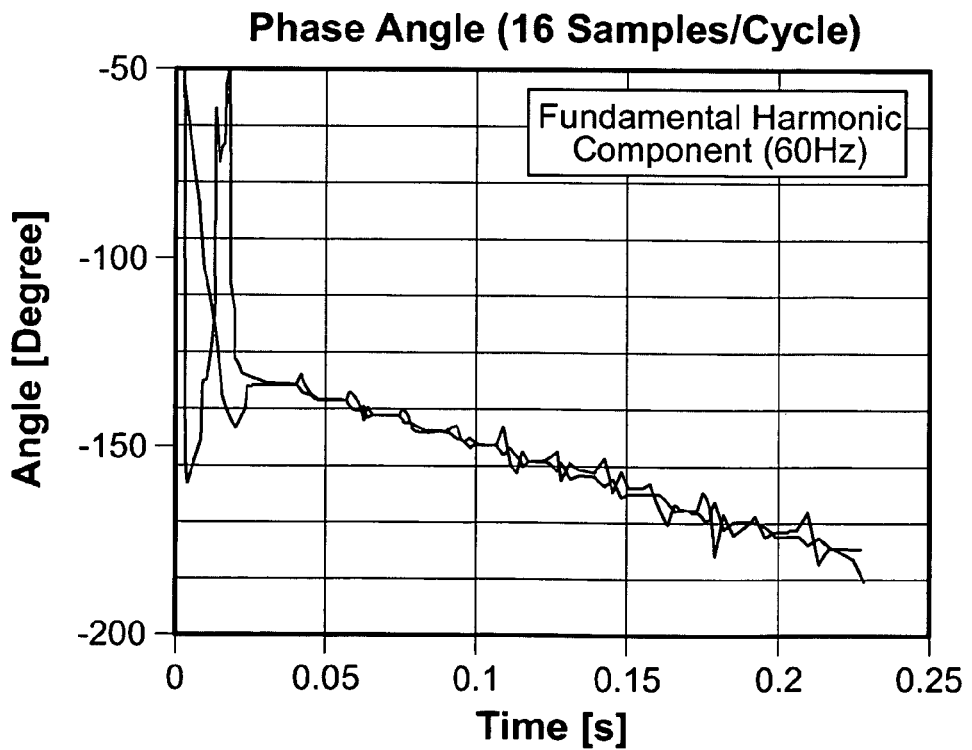
FIG. 12F is a phase angle difference graph of fundamental harmonics of the processed coil signal according to the present invention and the transformer inrush current.
Figure 12G:
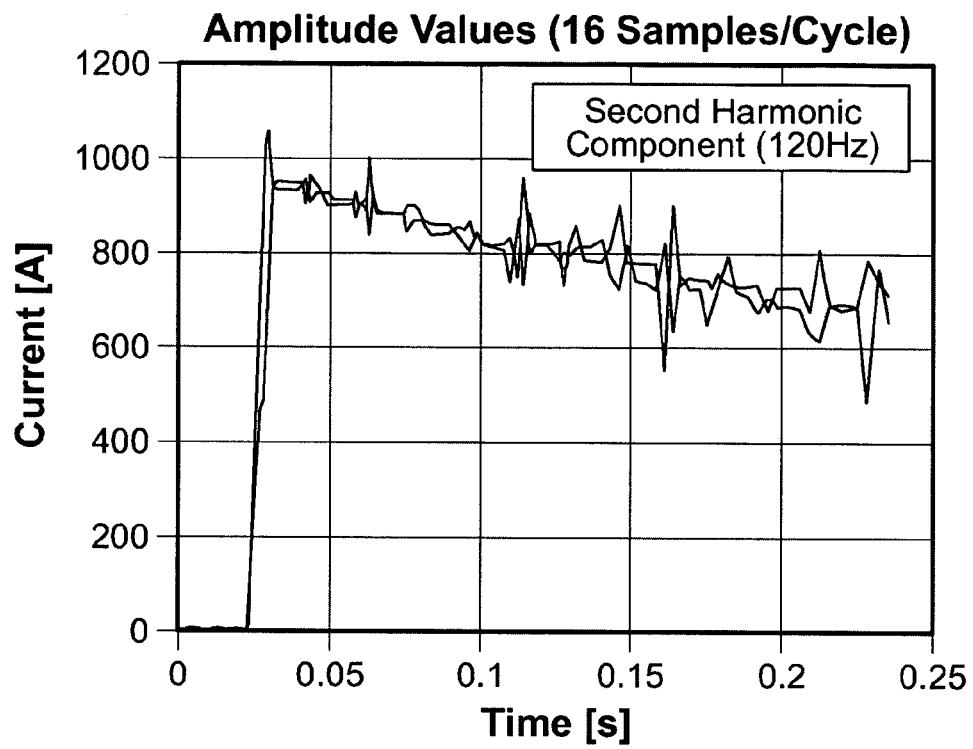
FIG. 12G is a root mean square current graph of a second harmonics of the processed coil signal according to the present invention and the transformer inrush current.
Figure 12H:
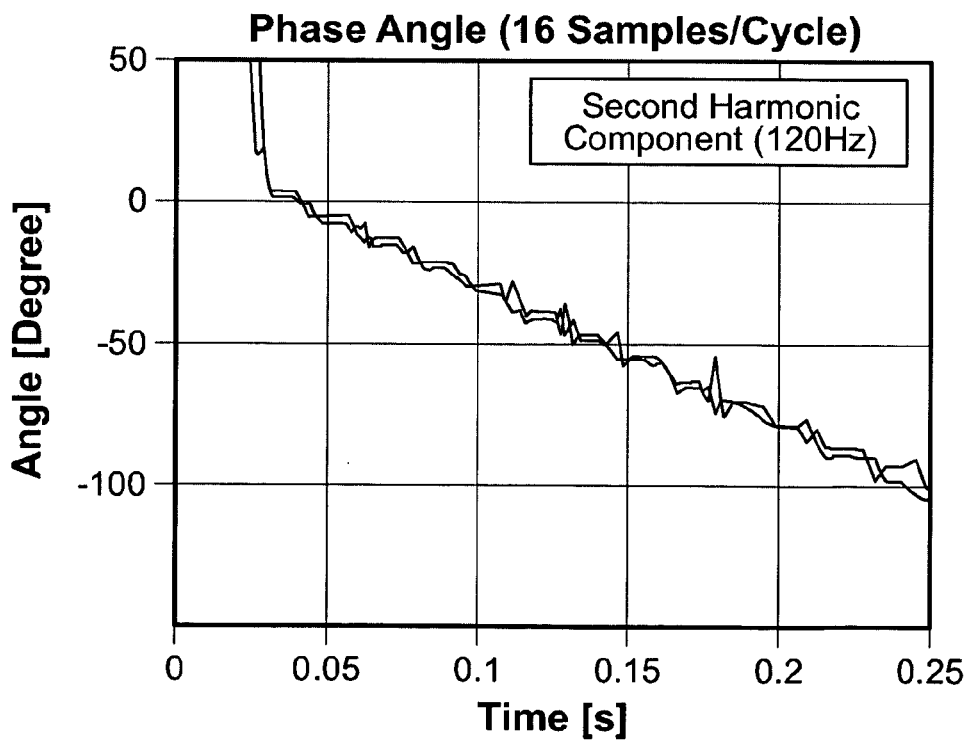
FIG. 12H is a phase angle difference graph of second harmonics of the processed coil signal according to the present invention and the transformer inrush current.

FIG. 12A shows primary current and the Rogowski coil secondary signal during a transformer energizing sampled at 16 samples per cycle in a protective relay system such as that shown in FIG. 1. The DC component of the primary current has been filtered by the relay consistently with the system of FIG. 7. The Rogowski coil secondary signal waveform (before it was shifted 90°) and the primary current waveform are shown in FIG. 12B). The phase angle difference between the primary current and the Rogowski coil secondary signal digitally shifted 90° becomes nearly zero (FIG. 12C). Calculated RMS values of all components for primary current and the Rogowski coil secondary signal scaled to the primary are nearly identical (FIG. 12D). Calculated RMS values and phase angles of the fundamental harmonic component (60 Hz) for primary current and the Rogowski coil secondary signal scaled to the primary are nearly identical (FIGS. 12E and 12F). Calculated RMS values and phase angles of the second harmonic components (120 Hz) for primary current and the Rogowski coil secondary signal scaled to the primary are also nearly identical (FIGS. 12G and 12H).

V. Conclusion

Embodiments of protective relay systems including Rogowski coils and signal processing techniques therefore are disclosed herein. Advantages of the invention include a simplified, yet highly effective and reliable, signal processing scheme wherein accurate representations of current flow may be provided at lower cost and in less time than conventional systems using more complex signal processing techniques and involving greater computational demands.

An embodiment of a protective system for a current path in a in an electrical power system is disclosed herein. The system comprises a Rogowski coil generating an output voltage signal corresponding to current flow in the current path; and a microprocessor based protection device receiving the output voltage signal. The microprocessor based protection device is responsive to the output voltage signal to cause the current path to be interrupted when a fault condition is detected, wherein the fault condition is detected without integration of the output voltage signal in the time domain.

Optionally, the voltage output signal may be processed in the frequency domain, and the phase of voltage output signal is digitally shifted by approximately 90 degrees The voltage output signal may further be multiplied by a scalar. The microprocessor based device may comprise a digital relay device, and the relay device may be configured to detect the fault condition. A second microprocessor based device may be separately provided from the protective device, and the second microprocessor based device may be configured to detect the fault condition, and may also be configured to integrate the voltage output signal to extract power analysis information. A circuit protector may be operatively connected to the protective device, with the protective device causing the circuit protector to open the current path in response to the output voltage signal.

An embodiment of a protective relay system for a current path in an electrical system is also disclosed herein. The system comprises a Rogowski coil generating an output voltage signal proportional to a time derivative of a current flow in the current path, and a microprocessor based relay device receiving a non-integrated output voltage signal of the Rogowski coil. The relay device causes the current path to be interrupted when a fault condition is detected using the non-integrated output voltage signal.

Optionally, the fault condition is detected without integration of the output voltage signal in the time domain. The voltage output signal may be processed in the frequency domain. The phase of the non-integrated voltage output signal may be digitally shifted by approximately 90 degrees, and the voltage output signal may be multiplied by a scalar. The relay may comprise a microprocessor and a memory, with the microprocessor and memory configured to detect the fault condition. A second microprocessor based device may be separately provided from the relay device, and the second microprocessor based device may process the non-integrated output voltage signal. A circuit protector may be operatively connected to the relay device, with the relay device causing the circuit protector to open the current path in response to the output voltage signal.

An embodiment of a protective relay system for managing an electrical system is also disclosed herein. The system comprises a conductor defining a current path in the electrical system, a Rogowski coil receiving the conductor and generating an analog output voltage signal proportional to a time derivative of current flow in the current path, and a digital relay device receiving the analog output voltage signal. The relay device is configured to digitize the signal and process the signal in the frequency domain to represent the current flow without integration of the output voltage signal in the time domain. The relay device causes the current path to be interrupted when a fault condition is detected using the represented current flow.

Optionally, the phase of the non-integrated voltage output signal may be digitally shifted by approximately 90 degrees, and the voltage output signal may be multiplied by a scalar. The relay may comprise a microprocessor and a memory, with the microprocessor and memory configured to detect the fault condition. A circuit protector may be operatively connected to the relay device, with the relay device causing the circuit protector to open the current path in response to the output voltage signal.

In an another embodiment, a digital relay device responsive to an output voltage signal of a Rogowski coil is disclosed. The relay device comprises a processor and a memory, wherein the processor and memory are configured to execute a control algorithm whereby the output voltage signal is processed in the frequency domain without integration of the output voltage signal in the time domain to determine a current signal corresponding to the output voltage signal.

Optionally, the processor and memory are further configured to detect a fault condition using the determined current signal. A circuit protector may be provided, with the relay causing the circuit protector to open a circuit path when the fault condition is detected. The output voltage signal may be multiplied by a scalar to determine the current signal, and the phase of the output voltage signal may be digitally shifted to determine the current signal. The output voltage of the Rogowski coil may be an analog signal, and the relay may comprise an analog to digital converter to digitize the output voltage signal.

A method of processing an output voltage signal of a Rogowski coil for control of a current path with a protective relay device is also disclosed. The method comprises obtaining the output voltage signal; digitizing the output signal; and determining a current signal corresponding the output voltage signal without integration of the output voltage signal in the time domain.

Optionally, determining the current signal may comprise applying a discrete transform algorithm to the digitized output signal, digitally shifting the phase of the digitized output signal, and multiplying the digitized signal by a scalar. The method may further comprise comparing the determined signal to a predetermined fault current signal, and detecting a fault condition based upon the compared determined signal and fault current signal. The method may also comprise causing a circuit protector to interrupt a current path extending through the Rogowski coil. Still further, the method may comprise storing in the relay device data relating to the determined current over time, extracting the data from the relay device, and integrating the extracted data with a microprocessor based device separate from the relay device.

An embodiment of a protective system for an electrical network is also disclosed. The system comprises a Rogowski coil monitoring a current path in an electrical system, and means for processing an output voltage signal of the Rogowski coil to provide a current signal corresponding to a time derivative of current flow in the current path. The means for processing provides the current signal while avoiding integration in the time domain of the output voltage signal.

Optionally, the means for processing may comprise a digital relay device. The system may also include means for interrupting the current flow in the current path when the provided current signal corresponds to a fault condition, means for storing data relating to the provided current signal over time, and means for extracting the stored data and analyzing the data.

While the invention has been described in terms of various specific embodiments, those skilled in the art will recognize that the invention can be practiced with modification within the spirit and scope of the claims.

What is claimed is:

1. A protective system for a current path in an electrical power system, the system comprising: a Rogowski coil that generates an output voltage signal corresponding to current flow in the current path; a microprocessor that receives the output voltage signal in frequency domain and that processes the output voltage signal to obtain a frequency domain representation of the current flow in the current path without integration of the output voltage signal in the time domain; and a protection device that determines whether a fault condition exists in the electrical power system based on the obtained frequency domain representation of the current flow, the protection device causing the current path to be interrupted when the fault condition is detected.

2. The system of claim 1, wherein the microprocessor processes the voltage output signal according to the following equation to obtain the frequency domain representation of the current flow: $I(jw)=-(V(jw))/(jwM)$, where I is current, V is voltage, jw is a Laplace operator, and M is a scalar multiplier.

3. The system of claim 2, wherein computation of the equation includes digitally shifting the phase of the voltage output signal by approximately 90 degrees.

4. The system of claim 1, wherein the protection device comprises a digital relay device.

5. The system of claim 1, wherein the microprocessor is a component of the protection device.

6. The system of claim 1, further comprising a second microprocessor that integrates the voltage output signal to extract power analysis information.

7. The system of claim 1, further comprising a circuit protector operatively connected to the protection device, the protection device causing the circuit protector to open the current path when the fault condition is detected.

8. A protective system for a current path in an electrical system, the system comprising:
a Rogowski coil that generates an output voltage signal proportional to a time derivative of a current flow in the current path;
a microprocessor that receives the output voltage signal and that processes the output voltage signal in the frequency domain to obtain a frequency domain representation of the current flow in the current path without integration of the output voltage signal in the time domain, the processing of the output voltage signal comprising the steps of
modifying at least one frequency component of the output voltage signal by a scalar multiplier, and
digitally shifting the phase of the output voltage signal by approximately 90 degrees; and
a relay device that causes the current path to be interrupted based on the obtained frequency domain representation of the current flow.

9. The system of claim 8, wherein the microprocessor processes the output voltage signal according to the following equation to obtain a frequency domain representation of the current flow: $I(jw)=-(V(jw))/(jwM)$, where I is current, V is voltage, jw is a Laplace operator, and M is a scalar multiplier.

10. The system of claim 8, wherein the relay device causes the current path to be interrupted upon detecting detect a fault condition in the current path based on the obtained frequency domain representation of the current flow.

11. The system of claim 8, wherein the microprocessor integrates the voltage output signal to extract power analysis information.

12. The system of claim 8, further comprising a circuit protector operatively connected to the relay device, the relay device causing the circuit protector to open the current path based on the obtained frequency domain representation of the current flow.

13. A protective relay system for managing an electrical system, the system comprising:
a conductor that defines a current path in the electrical system;
a Rogowski coil that receives the conductor and that generates an analog output voltage signal proportional to a time derivative of current flow in the current path; and
a digital relay device that receives the analog output voltage signal, digitizes the signal, and processes the digitized output voltage signal in the frequency domain to obtain a frequency domain representation of the current flow without integration of the output voltage signal in the time domain, the processing of the digitized output voltage signal comprising the steps of
modifying at least one frequency component of the output voltage signal by a scalar multiplier, and
digitally shifting the phase of the output voltage signal by approximately 90 degrees,
wherein the digital relay device causes the current path to be interrupted when a fault condition is detected based on the obtained frequency domain representation of the current flow.

14. The system of claim 13, wherein the digital relay device processes the voltage output signal according to the following equation to obtain the frequency domain representation of the current flow: $I(jw)=-(V(jw))/(jwM)$, where I is current, V is voltage, jw is a Laplace operator, and M is a scalar multiplier.

15. The system of claim 13, wherein the digital relay device comprises a microprocessor and a memory, the microprocessor and memory detecting the fault condition based on the obtained frequency domain representation of the current flow.

16. The system of claim 13, further comprising a circuit protector operatively connected to the digital relay device, the digital relay device causing the circuit protector to open the current path based on the obtained frequency domain representation of the current flow.

17. A protective system for an electrical network, comprising:
a Rogowski coil monitoring a current path in an electrical system; and
means for processing an output voltage signal of the Rogowski coil in the frequency domain to obtain a frequency domain representation of a current signal corresponding to a time derivative of current flow in the current path, the means for processing obtaining the frequency domain representation of the current signal by modifying at least one frequency component of the output voltage signal by a scalar multiplier, and
digitally shifting the phase of the output voltage signal by approximately 90 degrees,
the means for processing obtaining the frequency domain representation of the current signal without integrating the output voltage signal in the time domain.

18. The system of claim 17, wherein the means for processing comprises a digital relay device.

19. The system of claim 17, further comprising means for interrupting the current flow in the current path when the obtained frequency domain representation of the current signal corresponds to a fault condition.

20. The system of claim 17, further comprising means for storing data relating to the obtained frequency domain representation of the current signal over time; and
means for extracting the stored data and analyzing the data.

* * * * *